United States Patent
Doornbos et al.

(10) Patent No.: US 12,027,632 B2
(45) Date of Patent: Jul. 2, 2024

(54) SEMICONDUCTOR STRUCTURE WITH BARRIER AND METHOD FOR MANUFACTURING THE SAME

(71) Applicant: TAIWAN SEMICONDUCTOR MANUFACTURING COMPANY, LTD., Hsinchu (TW)

(72) Inventors: Gerben Doornbos, Hsinchu (TW); Marcus Johannes Henricus Van Dal, Hsinchu (TW); Mauricio Manfrini, Hsinchu (TW); Georgios Vellianitis, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 379 days.

(21) Appl. No.: 17/233,941

(22) Filed: Apr. 19, 2021

(65) Prior Publication Data
US 2022/0336679 A1    Oct. 20, 2022

(51) Int. Cl.
*H01L 29/786*     (2006.01)
*H01L 29/66*     (2006.01)

(52) U.S. Cl.
CPC .. *H01L 29/78696* (2013.01); *H01L 29/66742* (2013.01); *H01L 29/78618* (2013.01); *H01L 29/7869* (2013.01)

(58) Field of Classification Search
CPC ......... H01L 29/78696; H01L 29/66742; H01L 29/78618; H01L 29/7869; H01L 29/66969; H01L 29/41733; H01L 29/66606; H01L 29/66636
See application file for complete search history.

(56) References Cited

U.S. PATENT DOCUMENTS

| 9,991,394 | B2* | 6/2018 | Yamazaki | H01L 29/78696 |
| 2011/0024840 | A1* | 2/2011 | Khater | H01L 29/66628 |
| | | | | 257/E21.409 |
| 2011/0084272 | A1 | 4/2011 | Miyanaga et al. | |
| 2011/0309353 | A1* | 12/2011 | Kaneko | H01L 29/45 |
| | | | | 257/E21.477 |
| 2012/0064664 | A1 | 3/2012 | Yamazaki et al. | |

(Continued)

FOREIGN PATENT DOCUMENTS

| JP | 2013-246248 A | 12/2013 |
| JP | 2014-170841 A | 9/2014 |

(Continued)

OTHER PUBLICATIONS

U.S. Office Action for U.S. Appl. No. 17/233,899, dated Feb. 13, 2023.

(Continued)

*Primary Examiner* — Alia Sabur
(74) *Attorney, Agent, or Firm* — Birch, Stewart, Kolasch & Birch, LLP

(57) ABSTRACT

A semiconductor structure includes a channel layer including an oxide semiconductor material, source/drain contacts disposed below the channel layer, and barrier regions that are in contact with the channel layer and that surround the source/drain contacts, respectively. Each of the barrier regions includes a material that receives hydrogen. A method for manufacturing the semiconductor structure is also provided.

20 Claims, 26 Drawing Sheets

(56) References Cited

U.S. PATENT DOCUMENTS

| | | | |
|---|---|---|---|
| 2012/0112183 | A1 | 5/2012 | Endo et al. |
| 2014/0167133 | A1* | 6/2014 | Hirano ................ H01L 29/7889 257/316 |
| 2014/0239289 | A1* | 8/2014 | Morooka ................ H01L 29/45 257/43 |
| 2014/0246666 | A1* | 9/2014 | Morooka .......... H01L 29/42384 257/43 |
| 2015/0048361 | A1* | 2/2015 | Yamakita ............ H01L 27/1225 257/43 |
| 2015/0249156 | A1 | 9/2015 | Ohguro et al. |
| 2019/0172921 | A1 | 6/2019 | Dewey et al. |
| 2020/0098875 | A1* | 3/2020 | Sung ................ H01L 29/78681 |
| 2020/0388679 | A1 | 12/2020 | Song et al. |
| 2021/0399139 | A1* | 12/2021 | Li ........................... H10B 51/40 |
| 2021/0408291 | A1* | 12/2021 | Sharma .................. H10B 61/22 |
| 2021/0408296 | A1* | 12/2021 | Zhong .............. H01L 29/66742 |
| 2022/0157986 | A1* | 5/2022 | Yamazaki .............. H10B 12/00 |
| 2022/0336675 | A1* | 10/2022 | Vellianitis ........... H01L 29/7869 |
| 2022/0336678 | A1* | 10/2022 | Van Dal ............ H01L 29/66969 |
| 2023/0144044 | A1* | 5/2023 | Iikubo ................ H01L 27/1225 438/104 |

FOREIGN PATENT DOCUMENTS

| | | |
|---|---|---|
| JP | 2017-120896 A | 7/2017 |
| WO | WO2019/166906 A1 | 9/2019 |

OTHER PUBLICATIONS

U.S. Office Action for U.S. Appl. No. 17/234,015, dated Mar. 9, 2023.

U.S. Office Action for U.S. Appl. No. 17/234,015, dated Nov. 3, 2022.

Yu et al., "Tungsten-Doped Indium Oxide Thin Film as an Effective High-Temperature Copper Diffusion Barrier," ECS Solid State Letters, vol. 3, No. 6, 2014, pp. N15-N17.

Japanese Office Action for Japanese Application No. 2022-068005, dated May 23, 2023, with an English translation.

Taiwanese Search Report for Taiwanese Application No. 111102387, dated Apr. 19, 2023, with an English translation.

* cited by examiner

SEMICONDUCTOR STRUCTURE WITH BARRIER AND METHOD FOR MANUFACTURING THE SAME

BACKGROUND

As the manufacturing technology of integrated circuit (IC) advances, making transistors that are "scaled", that is, transistors that are smaller in size and higher in density, becomes a desirable object for the manufacturers. In attempting to achieve such object, a number of issues associated with the performance of the resulting transistors may be of interest.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
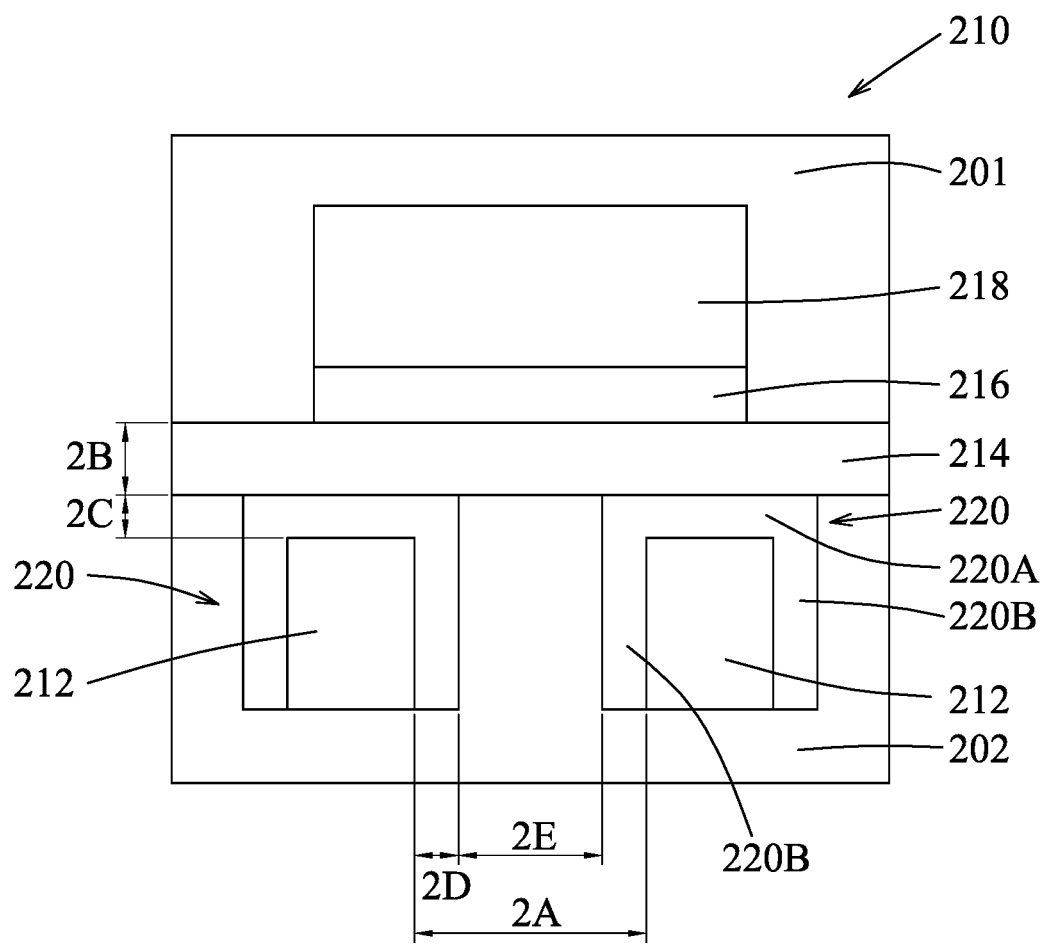
FIG. 1 illustrates a schematic cross-sectional view of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor structures, and particularly to TFTs (thin-film transistors) and methods for manufacturing the same. A TFT is one type of metal-oxide-semiconductor field-effect transistor (MOSFET), and may be manufactured by depositing different layers on a substrate. The TFTs may be used in a number of commercial applications such as gate driver circuits, high-frequency display application, etc. Generally, a TFT is similar to a MOSFET in structure, and includes a gate terminal, a source terminal and a drain terminal. A semiconductor layer known as a channel layer is deposited to contact the source terminal and the drain terminal.

Various materials have been proposed to be used for fabricating the TFTs. It may be beneficial to use oxide semiconductors such as indium gallium zinc oxide (IGZO) to form some parts of the TFTs (e.g., the channel layer), since the fabrication of such devices may be integrated in a back end of line (BEOL) portion of a semiconductor fabrication process, instead of a front end of line (FEOL) portion of the semiconductor fabrication process. Specifically, the forming of oxide semiconductors can be done without using processes such as doping activation annealing, such that the integration of the TFTs in the BEOL can be implemented in a low-temperature process to prevent damage to the devices that are already fabricated.

It is noted that chip area in the FEOL is considered more valuable than that in the BEOL, and it may be beneficial to integrate the fabrication of TFTs in the BEOL. Additionally, moving the fabrication of TFTs to the BEOL may result in a reduced chip area of approximately 5-10% for a given device.

In a typical TFT structure, two source/drain contacts may be disposed in contact with a channel layer. In determining the performance of the TFTs, quality of the channel layer plays a significant role, particularly for TFTs that are scaled (that is, TFTs that are made with a smaller size to achieve a higher transistor density). For example, an electrical resistance between the channel layer and the metals of the source/drain contacts, which may be referred to as a contact resistance, may be of interest because a drive current of the scaled TFTs, which is a major parameter for determining the performance of the TFTs, is mainly dominated by the contact resistance. As such, a reduced contact resistance between the channel layer and the metals of the source/drain contacts may improve the performance of the TFTs.

Additionally, the channel layer of the TFTs fabricated in the BEOL may be sensitive to hydrogen (e.g., hydrogen gas and/or free hydrogen atoms), which may be generated or used in many processes, such as chemical vapor depositions (CVD). Upon annealing process, hydrogen gas and/or free hydrogen atoms may be incorporated into the deposited material, and may move from source/drain contacts through an interlayer dielectric (ILD) layer to reach and react with the channel layer. In the following, InGaZnO$_4$ is exemplified as a material of the channel layer, and 2H is used to represent hydrogen gas or two free hydrogen atoms. A reaction between the hydrogen gas (or free hydrogen atoms) and the channel layer may be represented as follow: $2H+InGaZnO_4 \rightarrow H_2O+InGaZnO_3-O_{vacancy}$. The oxygen vacancy $O_{vacancy}$ acts as a double donor state (each oxygen vacancy can donate two free electrons), and thus the channel layer is doped, which may change the electrical properties of the channel layer and may lead to strong negative threshold voltage shift. That is to say, an interaction between the metal of the source/drain contacts and the oxide semiconductor material of the channel layer may result in undesired doping due to the hydrogen gas and/or hydrogen atoms diffusing from the metal material (such as a material for forming the source/drain contacts) into the oxide semiconductor material. This is a phenomenon known as hydrogen diffusion or H-diffusion.

FIG. 1 illustrates a schematic cross-sectional view of a semiconductor structure 200 in accordance with some embodiments. The semiconductor structure 200 may include a first dielectric layer 201, a second dielectric layer 202, and a transistor 210 formed between the first dielectric layer 201 and the second dielectric layer 202. In some embodiments, each of the first dielectric layer 201 and the second dielectric layer 202 may serve as an interlayer dielectric (ILD) layer of the BEOL, and may include such as, but not limited to, silica ($SiO_2$), hafnium silicate ($HfSiO_4$), zirconium silicate (Zr-$SiO_4$), or combinations thereof. In alternative embodiments, each of the first dielectric layer 201 and the second dielectric layer 202 may include, but not limited to, polyimide, epoxy resin, acrylic resin, phenol resin, benzocyclobutene (BCB), polybenzooxazole (PBO), other suitable polymer-based dielectric materials, or combinations thereof. Other suitable dielectric materials are within the contemplated scope of the present disclosure.

In some embodiments, the transistor 210 may be a TFT that may be fabricated in the BEOL, but is not limited as such. The transistor 210 includes two source/drain contacts 212 formed in the second dielectric layer 202, a channel layer 214 located over the two source/drain contacts 212, a gate dielectric 216 formed on the channel layer 214, a gate electrode 218 formed on the gate dielectric 216, and two barrier regions 220 each surrounding a respective one of the source/drain contacts 212.

In this semiconductor structure 200, the source/drain contacts 212 are located below the channel layer 214, and the gate electrode 218 is located over the channel layer 214. This semiconductor structure 200 is typically referred to as a back-contacted, front-gate structure. It is noted that in relevant fields, the terms "front/back" and "top/bottom" may be used interchangeably. That is, the semiconductor structure 200 may be also referred to as a bottom-contacted, top-gate structure. It is noted that due to the nature of wire routing in some specific applications, it may be beneficial to fabricate the associated transistors with the back-contacted, front-gate structure to simplify the wire routing so as to connect the transistors with other components. Examples of such applications may include, but not limited to, a power gate used for switching off logic blocks in standby mode, a memory selector used in memory elements such as magnetoresistive random access memory (MRAM) and resistive random access memory (RRAM), an input/output (I/O) device that serves as an interface between a computing element (e.g., CPU) and an external device (e.g., a hard drive), etc.

The source/drain contacts 212 are typically fabricated using metals such as tungsten (W), ruthenium (Ru), copper (Cu), titanium nitride (TiN), tantalum nitride (TaN), or combinations thereof. Other suitable metal materials are within the contemplated scope of the present disclosure. It is noted that the formation of the source/drain contacts 212 defines a channel length (as indicated by the arrow 2A) which may be in a range between about 25 to about 100 nanometers, although a longer or shorter length may be used based on the product to be fabricated.

It is noted that since the transistor 210 may be fabricated in the BEOL, the source/drain contacts 212 may be configured to be connected to one of a number of metal contact lines (M0, M1, . . . , Mx) that interconnects different layers in a part of the BEOL stack.

The channel layer 214 may include an oxide semiconductor material such as, but not limited to, indium gallium zinc oxide (IGZO), indium zinc oxide (IZO), zinc oxide (ZnO), indium tin oxide (InSnO), tungsten-doped indium oxide (InWO), gallium oxide ($GaO_x$; e.g., $Ga_2O_3$), indium oxide ($InO_x$; e.g., $In_2O_3$), and the like. In alternative embodiments, the channel layer 214 may further include, for example, but not limited to, amorphous silicon, crystalline silicon, or the like. Other suitable channel materials are within the contemplated scope of the present disclosure. In some embodiments, a thickness of the channel layer 214 (as indicated by the arrow 2B) may be in a range of about 4 to about 10 nanometers, although a wider or narrower thickness may be used based on the product to be fabricated.

The gate dielectric 216 may include a high-k dielectric material such as, but not limited to, silicon oxide ($SiO_2$), silicon nitride ($Si_3N_4$), silicon oxynitride ($SiO_xN_y$), hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), zirconium silicate, zirconium aluminate, zirconium oxide, titanium oxide, aluminum oxide ($Al_2O_3$), hafnium dioxide-alumina ($HfO_2$—$Al_2O_3$) alloy, or combinations thereof. Other suitable gate dielectric material layers are within the contemplated scope of the present disclosure.

The gate electrode 218 may include a metallic material, a metal compound, polycrystalline silicon, or doped silicon. Other suitable materials for fabricating the gate electrode 218 are within the scope of the present disclosure. The metallic material may include, for example, but not limited to, silver (Ag), aluminum (Al), copper, tungsten, nickel (Ni), other suitable materials, alloys thereof, or combinations thereof. The metal compound may include, for example, but not limited to, titanium nitride (TiN), tantalum nitride (TaN), metal silicide, other suitable materials, or combinations thereof. Other suitable materials for fabricating the gate electrode 218 are within the contemplated scope of the present disclosure.

In some embodiments, each of the two barrier regions 220 is dimensioned to be inverted U-shaped to surround the two source/drain contacts 212, respectively. In some embodiments, each of the two barrier regions 220 has an interconnecting section 220A that is located between the channel layer 214 and a respective one of the two source/drain contacts 212, and two extending sections 220B that respectively extend from two ends of the interconnecting section 220A, to be in contact with the respective one of the two source/drain contacts 212.

Each of the two barrier regions 220 may include indium gallium zinc oxide (IGZO), indium zinc oxide (IZO), zinc oxide (ZnO), indium tin oxide (InSnO), tungsten-doped indium oxide (InWO), indium oxide (InO$_x$; e.g., In$_2$O$_3$), gallium oxide (GaO$_x$, e.g., Ga$_2$O$_3$), crystalline InZnGaO$_x$ (c-IGZO), indium gallium silicon zinc oxide (IGSZO, InGaSiZnO$_x$), Zr$_x$Ni$_y$, or combinations thereof. Zr$_x$Ni$_y$ is a metal compound including Zr (zirconium) and Ni (nickel). Other suitable materials for fabricating the two barrier regions 220 are within the contemplated scope of the present disclosure. A thickness of each of the interconnecting sections 220A and the extending sections 220B of the barrier regions 220 (as indicated by the arrows 2C and 2D, respectively) may be in a range of about 2 to about 10 nanometers, although a wider or narrower thickness may be used based on the product to be fabricated.

It is noted that in order for the transistor 210 to function normally, two adjacent ones of the extending sections 220B of the two barrier regions 220 cannot be in contact with each other. In some embodiments, a distance between the two adjacent extending sections 220B (as indicated by the arrow 2E) is larger than about 15 nanometers, although a slightly shorter distance may be used based on the product to be fabricated.

It is noted that, with the provision of the barrier regions 220, the structure of the transistor 210 as described above may offer a number of advantages. For example, a contact resistance between the channel layer 214 and one of the two source/drain contacts 212 may be rendered lower. Additionally, the hydrogen gas and/or free hydrogen atoms moving away from the two source/drain contacts 212 may be absorbed by the barrier regions 220 instead of the channel layer 214, and therefore may reduce the occurrence of H-diffusion phenomenon and associated adverse effects.

Figure 2:
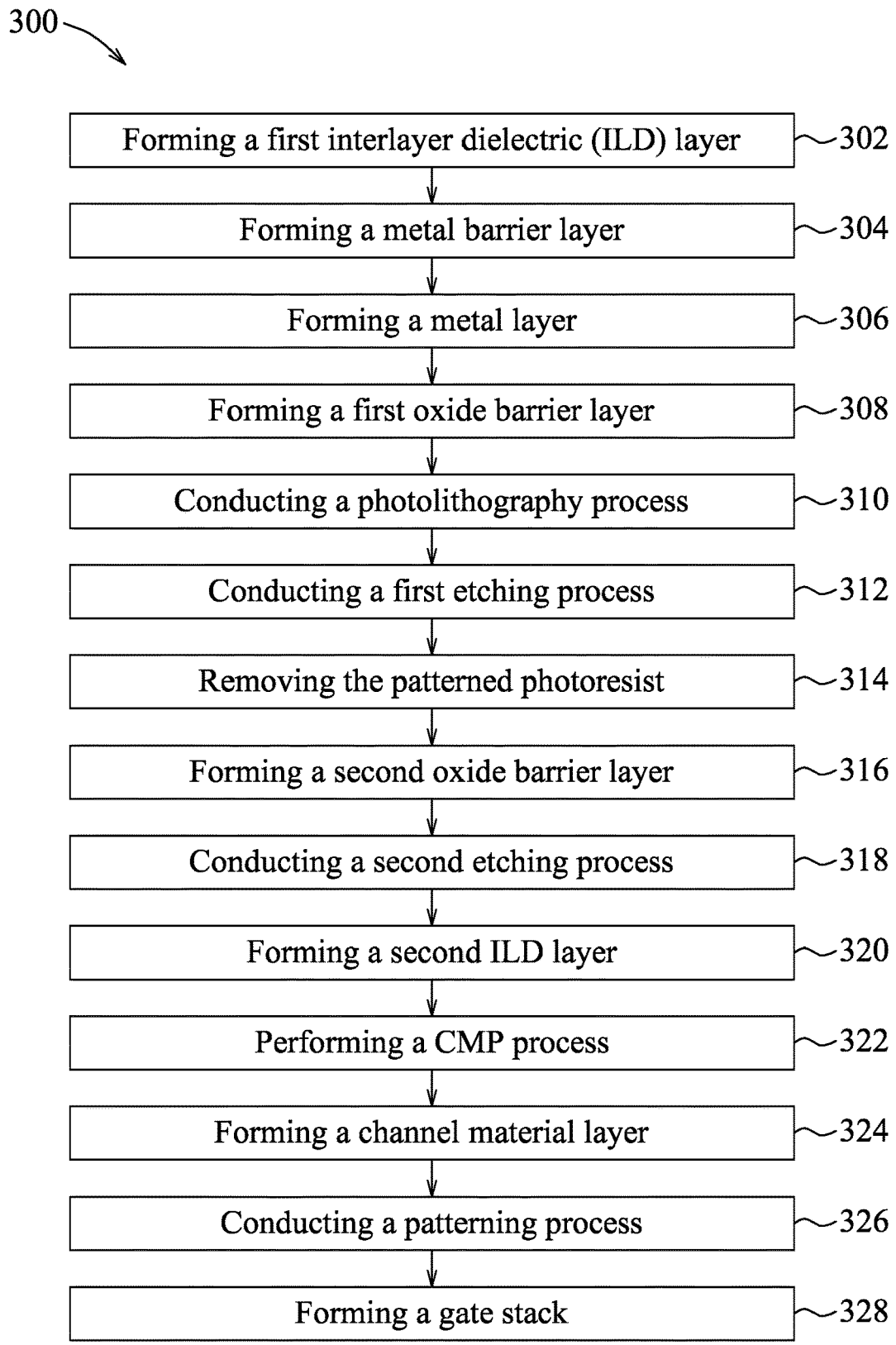
FIG. 2 is a flow diagram illustrating a method for manufacturing a semiconductor structure of FIG. 1 in accordance with some embodiments.

FIG. 2 is a flow diagram illustrating a method 300 for manufacturing a semiconductor structure, for example, the semiconductor structure 200, in accordance with some embodiments. FIGS. 3 to 17B illustrate schematic views of intermediate stages of the method 300.

Figure 3:
FIGS. 3 to 17B illustrate schematic views of intermediate stages of a method for manufacturing the semiconductor structure as depicted in FIG. 2 in accordance with some embodiments.

Referring to FIGS. 2 and 3, the method begins at step 302, where a first interlayer dielectric (ILD) layer 400 is formed. Step 302 may be implemented using, for example, but not limited to, CVD, physical vapor deposition (PVD), sputtering, combinations thereof, or other suitable techniques. In some embodiments, the first ILD layer 400 may be a single material layer. In alternative embodiments, the first ILD layer 400 may be constituted by multiple films made of different materials. In some embodiments, the materials for making the first ILD layer 400 is similar to those for making the first dielectric layer 201 and the second dielectric layer 202, and the details thereof are omitted herein for the sake of brevity. In some embodiments, step 302 may be implemented in BEOL of the fabrication process.

Figure 4:

Referring to FIGS. 2 and 4, the method 300 proceeds to step 304, where a metal barrier layer 410 is formed on the first ILD layer 400. Step 304 may be implemented using, for example, but not limited to, CVD, PVD, atomic layer deposition (ALD), sputtering, combinations thereof, or other suitable techniques. The metal barrier layer 410 may include, for example, but not limited to, titanium nitride (TiN), tantalum nitride (TaN), or combinations thereof. Other suitable materials for forming the metal barrier layer 410 are within the contemplated scope of the present disclosure.

Figure 5:
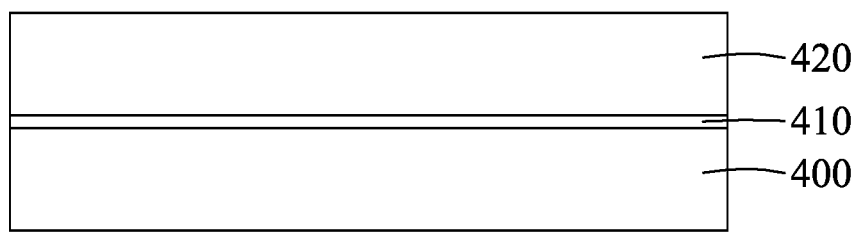

Referring to FIGS. 2 and 5, the method 300 proceeds to step 306, where a metal layer 420 is formed on the metal barrier layer 410. The materials for forming the metal layer 420 may be similar to those for forming the source/drain contacts 212, and the details thereof are omitted herein for the sake of brevity. The metal layer 420 may be formed using PVD, CVD, ALD, plating, or other suitable deposition techniques. A thickness of the metal layer 420 may correspond to a thickness of the source/drain contacts 212 shown in FIG. 1, and may be in a range of about 30 to about 70 nanometers, although a wider or narrower thickness may be used based on the product to be fabricated.

Figure 6:

Referring to FIGS. 2 and 6, it is noted that in some embodiments, based on the different fabrication processes, the metal barrier layer 410 is an optional component, and the formation of the barrier layer 410 (step 304) may be omitted. In such a case, the flow of the method may proceed from step 302 to 306 directly, and the metal layer 420 is formed on the first ILD layer 400. For the sake of brevity, the configuration of FIG. 6 will be used for illustration hereinafter.

Figure 7:
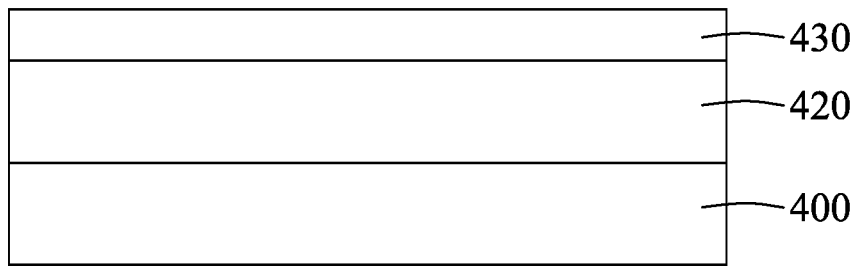

Referring to FIGS. 2 and 7, the method 300 proceeds to step 308, where a first barrier layer 430 is formed on the metal layer 420. The materials for forming the first barrier layer 430 may be similar to those for forming the barrier regions 220, and the details thereof are omitted herein for the sake of brevity. The first barrier layer 430 may be formed using PVD, CVD, ALD, plating, or other suitable deposition techniques. A thickness of the first barrier layer 430 may correspond to the thickness of each of the interconnecting sections 220A of the barrier regions 220 shown in FIG. 1.

Figure 8:
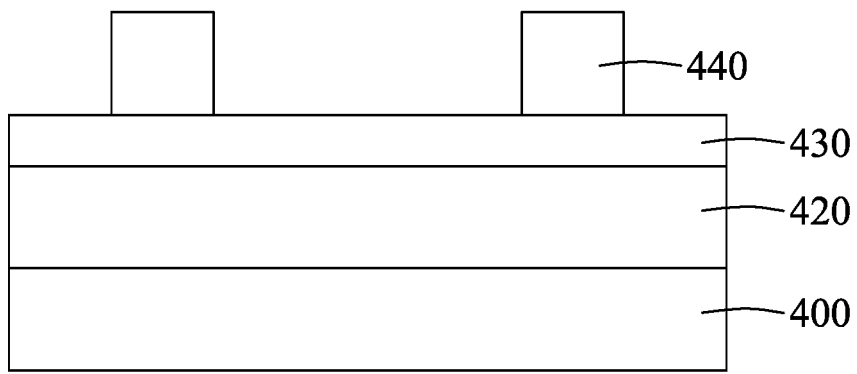

Referring to FIGS. 2 and 8, the method 300 proceeds to step 310, where a photolithography process is conducted. In some embodiments, the photolithography process may include, for example, but not limited to, coating a photoresist layer on the first barrier layer 430, then soft-baking, exposing the photoresist through a photomask (not shown in the drawings), post-exposure baking, developing the photoresist, followed by hard-baking so as to form a patterned photoresist 440.

Figure 9:
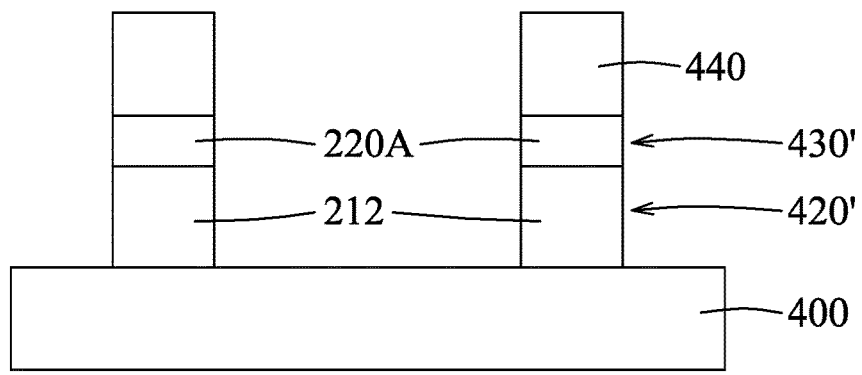

Referring to FIGS. 2 and 9, the method 300 proceeds to step 312, where a first etching process is conducted to pattern the metal layer 420 and the first barrier layer 430. As a result, a patterned metal layer 420' is formed to have two metal sections that may serve as the source/drain contacts 212 of the transistor 210 shown in FIG. 1, and thus are also denoted by the numeral 212, and a patterned first barrier layer 430' is formed to have two barrier sections, each located over the two metal sections 212, respectively, to serve as the interconnecting sections 220A of the barrier regions 220 of the transistor 210 shown in FIG. 1. The two barrier sections are also denoted by the numeral 220A. It is noted that a distance between the two metal sections 212 may correspond to a distance between the source/drain contacts 212 shown in FIG. 1.

The first etching process may be implemented by etching the metal layer 420 and the first barrier layer 430 through the patterned photoresist 440 using, for example, but not limited to, a dry etching process, a wet etching process, other suitable processes, or combinations thereof. It is noted that in some embodiments, the first etching process may be performed in a two-step manner: first implementing a first step of the first etching process that includes etching the first barrier layer 430, followed by a second step of the first etching process that includes etching the metal layer 420. Each of the first and second steps may be done using a dry etching process, a wet etching process, other suitable processes, or combinations thereof.

Figure 10:
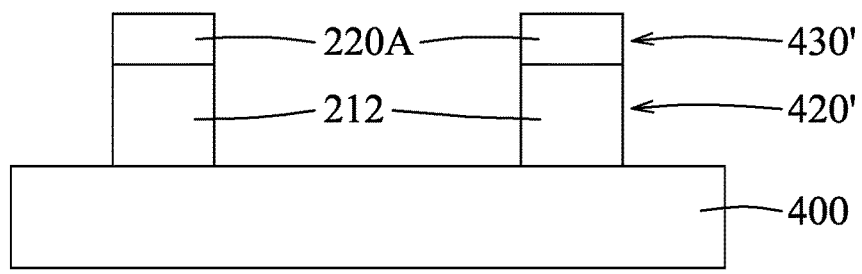

Referring to FIGS. 2 and 10, the method 300 proceeds to step 314, where the patterned photoresist 440 is stripped. Based on the materials used for forming the patterned photoresist 440, a number of suitable chemical solutions may be used to strip the patterned photoresist 440.

Figure 11:
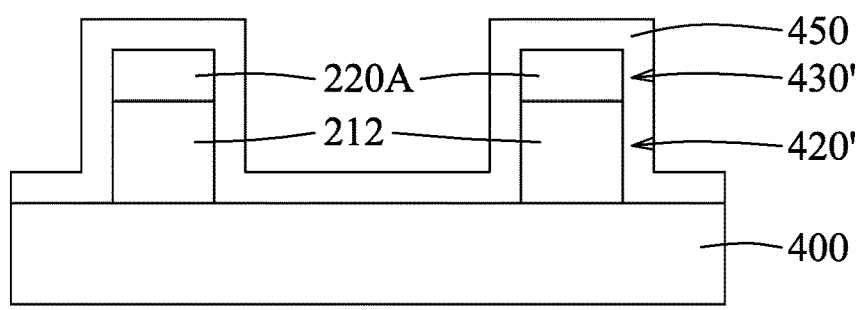

Referring to FIGS. 2 and 11, the method 300 proceeds to step 316, where a second barrier layer 450 is conformally formed to cover the patterned first barrier layer 430', the patterned metal layer 420', and the first ILD layer 400. The materials and process for forming the second barrier layer 450 are similar to those for forming the first barrier layer 430, and the details thereof are omitted herein for the sake of brevity. A thickness of the second barrier layer 450 may correspond to the thickness of each of the extending sections 220B of the barrier regions 220 shown in FIG. 1. In some embodiments, the second barrier layer 450 may include a material that is different from that of the first barrier layer 430, a material that is the same as that of the first barrier layer 430 but with different stoichiometry or phase, or a material that is exactly the same as that of the first barrier layer 430.

Figure 12A:
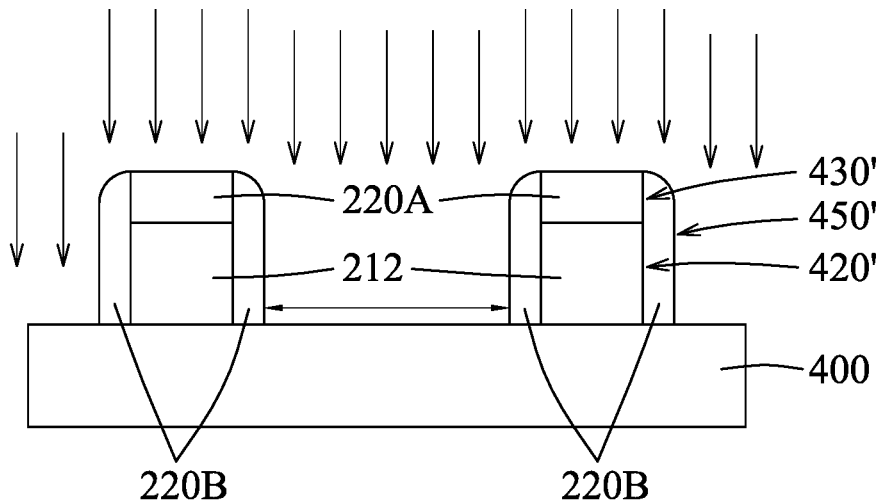
Figure 12B:
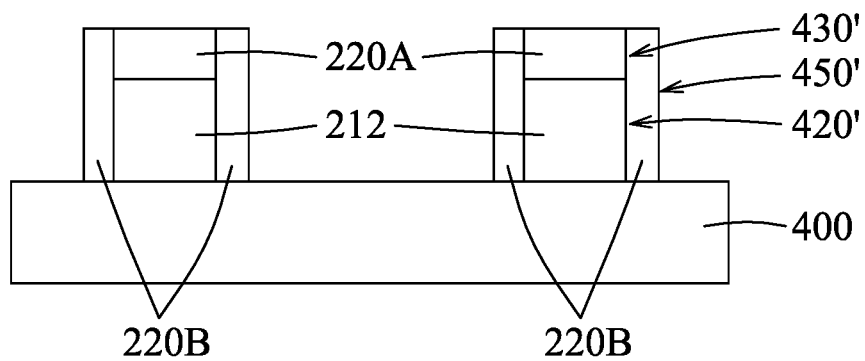

Referring to FIGS. 2 and 12A, the method 300 proceeds to step 318, where a second etching process is conducted to pattern the second barrier layer 450 shown in FIG. 11. In some embodiments, the second etching process may be implemented using an anisotropic etching process which may be a dry etching process, a wet etching process, other suitable processes, or combinations thereof, to remove portions of the second barrier layer 450 in a top-down direction (as shown by the vertical arrows in FIG. 12A). As a result, the second etching process produce a patterned second barrier layer 450' that includes pairs of barrier sidewalls (in the form of "spacers"), each pair corresponding to the extending sections 220B of each of the barrier regions 220 shown in FIG. 1. Therefore, the sidewall portions are also denoted by the numeral 220B. The patterned second barrier layer 450' and the patterned first barrier layer 430' together surround the two metal sections 212 of the patterned metal layer 420'. It is noted that differences in the type and quality of the etching process used in this step may result in the barrier sidewalls having different shapes. For example, as shown in FIG. 12A, the top corners of the barrier sidewalls are rounded, and as shown in FIG. 12B, the top corners of the barrier sidewalls have right angles (i.e., about 90 degrees). A width of each of the barrier sidewalls 220B may correspond to the thickness of the extending sections 220B of the barrier regions 220 shown in FIG. 1, and a distance between two adjacent barrier sidewalls 220B (as indicated by the horizontal arrow in FIG. 12A) may correspond to the distance between two adjacent extending sections 220B shown in FIG. 1. For the sake of simplicity, the configuration of FIG. 12B will be used for subsequent figures.

Figure 13:
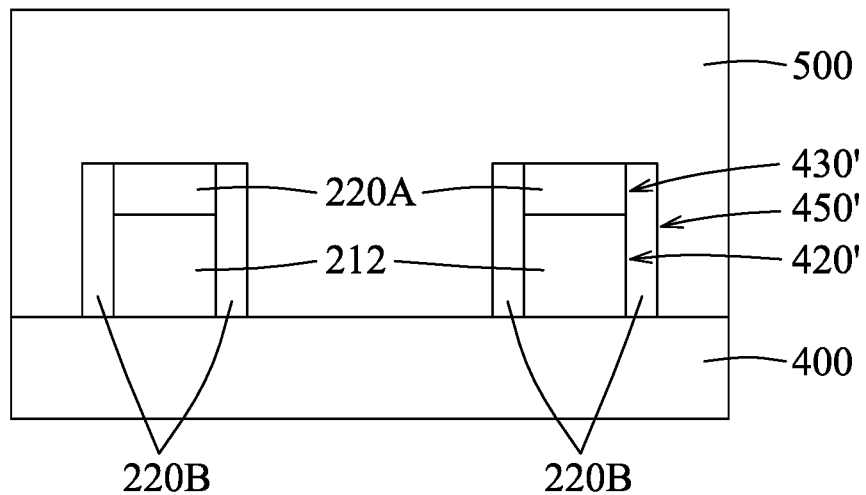

Referring to FIGS. 2 and 13, the method 300 proceeds to step 320, where a second ILD layer 500 is formed on the first ILD layer 400, the patterned first barrier layer 430', and the patterned second barrier layer 450'. The materials and process used for forming the second ILD layer 500 are similar to those for forming the first ILD layer 400, and the details thereof are omitted herein for the sake of brevity. In some embodiments, the second ILD layer 500 may be a single material layer. In alternative embodiments, the second ILD layer 500 may be constituted by multiple films made of different materials which are suitable for forming the first dielectric layer 201 and the second dielectric layer 202. It is noted that the second ILD layer 500 may include a material that is different from that of the first ILD layer 400, or a material that is exactly the same as that of the first ILD layer 400.

Figure 14:
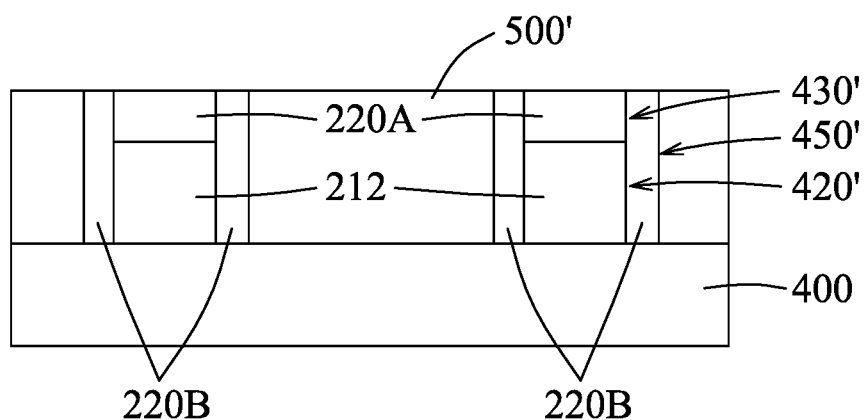

Referring to FIGS. 2 and 14, the method 300 proceeds to step 322, where a chemical-mechanical planarization (CMP) process or other suitable process is performed to planarize a top surface of the second ILD layer 500. In some embodiments, the CMP process may be performed to the point that the patterned first barrier layer 430' and the barrier sidewalls of the patterned second barrier layer 450' are exposed, so as to form a planarized second ILD layer 500'. As a result, the two source/drain contacts 212 and the corresponding barrier regions 220 of the transistor 210 shown in FIG. 1 are fabricated at this stage, and the first ILD layer 400 and the planarized second ILD layer 500' formed at this stage may correspond to the second dielectric layer 202 of the semiconductor structure 200 shown in FIG. 1.

Figure 15:
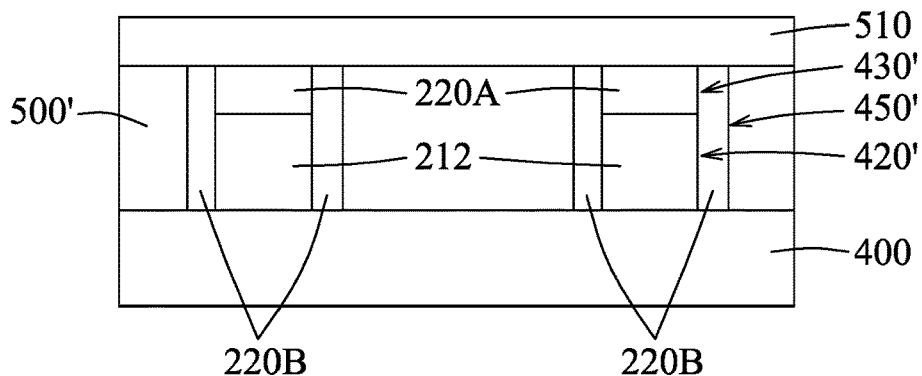

Referring to FIGS. 2 and 15, the method 300 proceeds to step 324, where a channel material layer 510 is formed on the patterned first barrier layer 430', the patterned second barrier layer 450', and the planarized second ILD layer 500'. The materials and thickness of the channel material layer 510 may be similar to those of the channel layer 214 shown in FIG. 1, and the details thereof are omitted herein for the sake of brevity. Step 324 may be implemented using CVD, PVD, ALD, plasma-enhanced CVD (PECVD), epitaxial growth, or other suitable techniques.

Figure 16A:
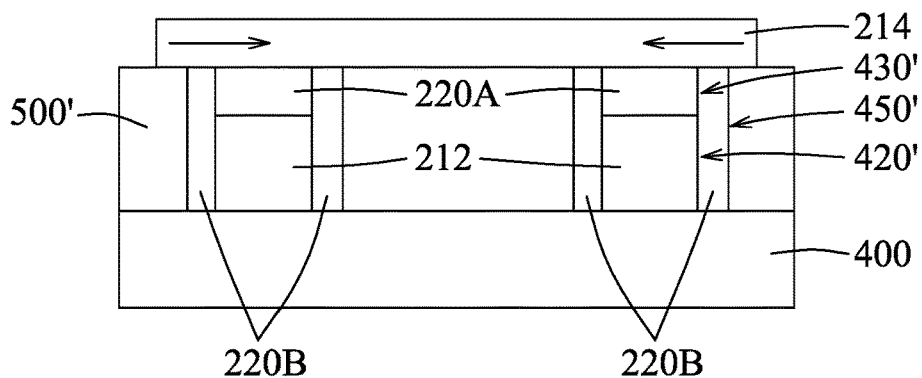

Referring to FIGS. 2 and 16A, the method 300 proceeds to step 326, where a patterning process is conducted. In some embodiments, the patterning process may be implemented using procedures similar to the ones described in steps 310 to 314, that is, conducting a photolithography process described in step 310 to form a patterned photoresist on the channel material layer 510, conducting an etching process described in step 312 to form a patterned channel material layer, and removing the patterned photoresist. In some embodiments, the patterned channel material layer may correspond to the channel layer 214 shown in FIG. 1, and thus is also denoted by the numeral 214.

Figure 16B:
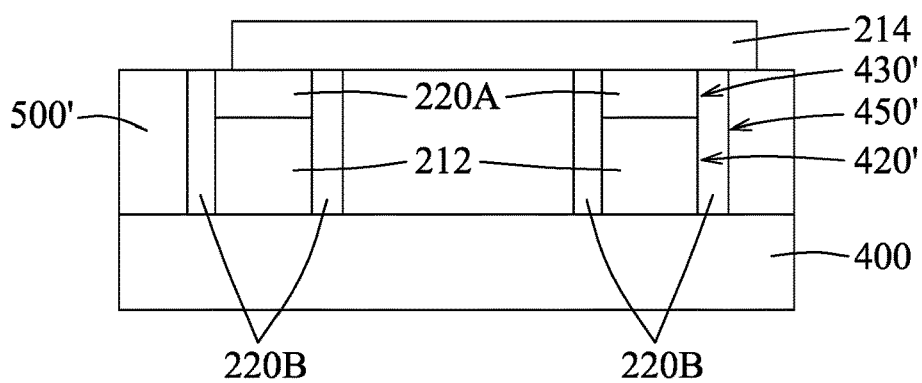
Figure 16C:
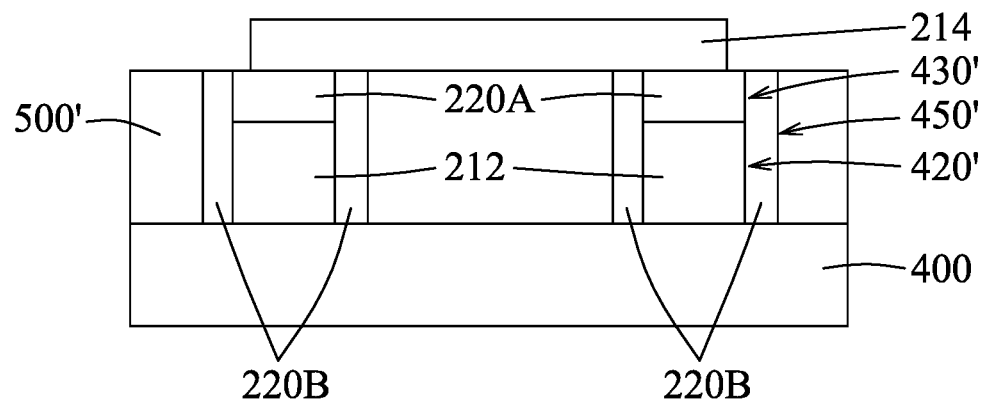

It is noted that the patterning process is generally done in order to isolate adjacent transistors that are fabricated in a same process, and the patterned channel material layer 214 is formed to at least partially cover the patterned first barrier layer 430' and the patterned second barrier layer 450' (i.e., the barrier regions 220 shown in FIG. 1). In addition, an alignment of the patterned channel material layer 214 with respect to the two source/drain contacts 212 on a horizontal direction may not need to be in a symmetric manner. That is to say, in some embodiments, a dimension of the patterned channel material layer 214 may be as illustrated in FIG. 16A, and may be shrunk inwardly from each of the two opposite ends, for an arbitrary amount within the ranges as indicated by the arrows in FIG. 16A without adversely affecting the performance of the resulting transistor 210 shown in FIG. 1. Specifically, the patterned channel material layer 214 are to be patterned to at least cover, from a front direction, a part of each of the two metal sections 212 of the patterned metal layer 420', so as to ensure the performance of the resulting transistor 210 is not adversely affected. FIG. 16B illustrates one alternative of the dimensions of the patterned channel material layer 214, which is aligned asymmetrically (by design, or by process limitations resulting in misalignment) with respect to the two metal sections 212 of the patterned metal layer 420' as compared with that illustrated in FIG. 16A, in accordance with some embodiments. FIG. 16C illustrates one alternative of the dimensions of the patterned channel material layer 214, which is shrunk inwardly with respect to that as illustrated in FIG. 16A, i.e., to only partially cover a part of each of the two metal sections 212 of the patterned metal layer 420', in accordance with some embodiments. For the sake of simplicity, the dimension of the patterned channel material layer 214 as illustrated in FIG. 16A will be used for subsequent figures.

Figure 17A:
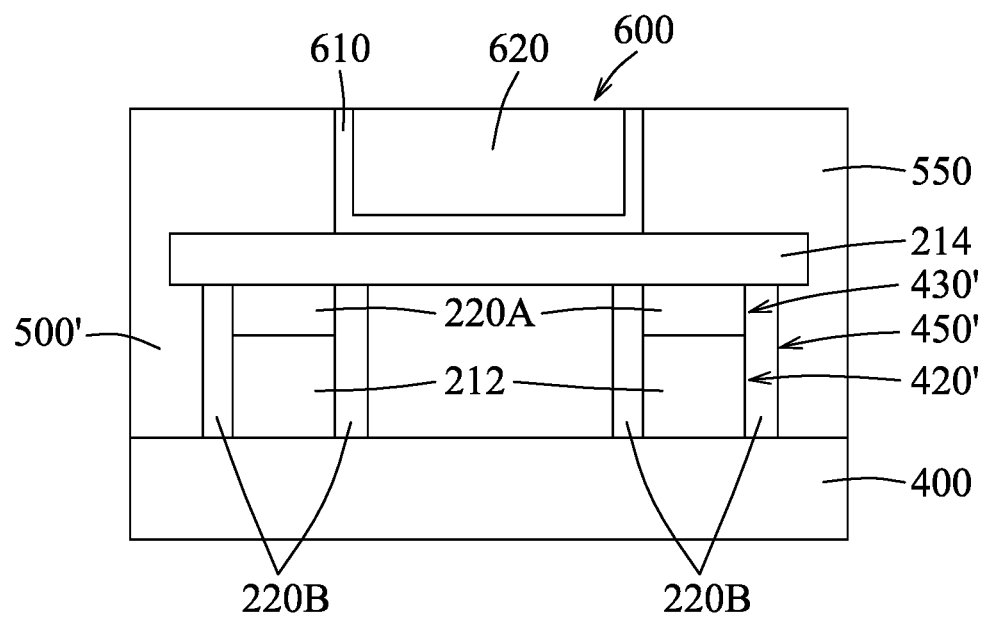
Figure 17B:
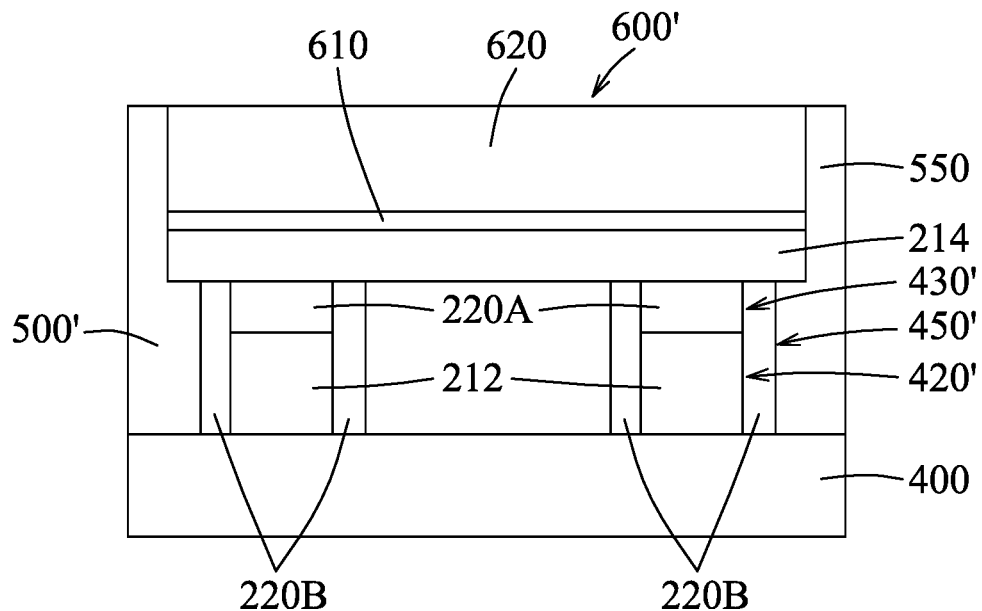

Referring to FIGS. 2 and 17A, the method 300 proceeds to step 328, where a gate stack 600 is formed on the patterned channel material layer 214 in a third ILD layer 550. The gate stack 600 may include a gate electrode 620 and a gate dielectric 610 which may be made of materials similar to those for making the gate electrode 218 and the gate dielectric 216, respectively, as shown in FIG. 1, and the details thereof are omitted herein for the sake of brevity. FIG. 17B illustrates an alternative structure of a gate stack 600' that may be formed on the patterned channel material layer 214. It is noted that for the gate stack 600' shown in FIG. 17B, the gate dielectric 610 is disposed below the gate electrode 620, and for the gate stack 600 shown in FIG. 17A, the gate dielectric 610 is disposed to surround the gate electrode 620. It is noted that the gate stacks 600 and 600' may be formed in a number of ways, for example, using processes 1900 and 2500 to be described hereinafter, or other suitable processes.

In some embodiments, a gate replacement technique is employed for forming the gate stack 600. For example, a dummy gate made using, for example, polysilicon, may be first formed, and then replaced using a gate stack having the structures shown in FIG. 17A or 17B.

Figure 18:
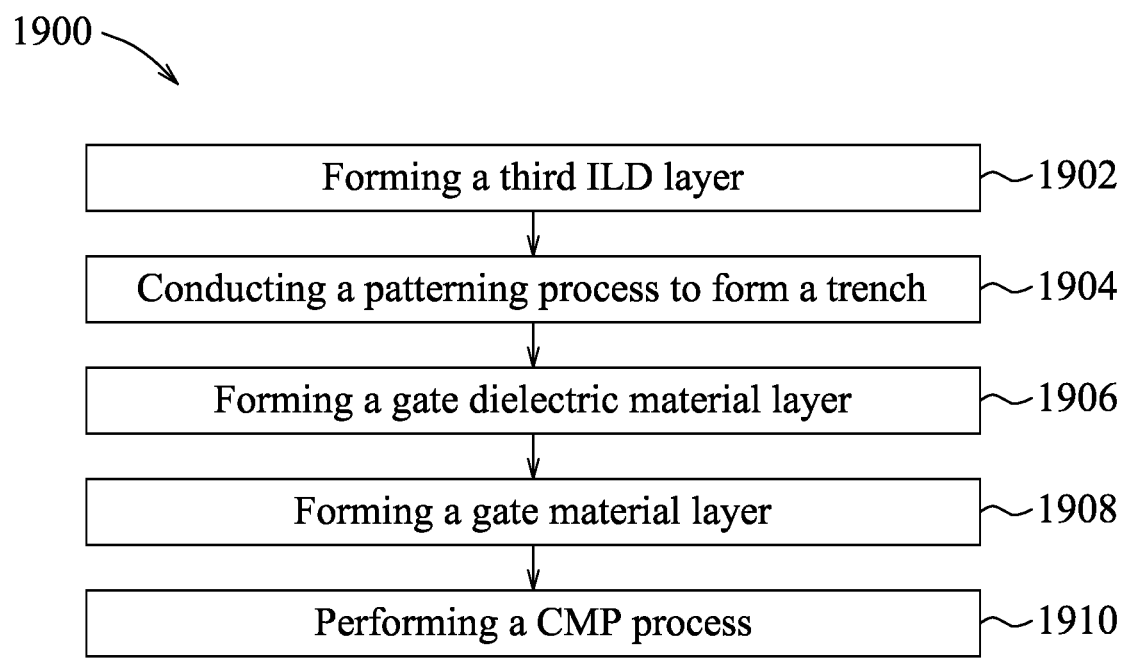
FIG. 18 is a flow diagram illustrating an exemplary process for forming a gate stack shown in FIG. 17A in accordance with some embodiments.

FIG. 18 is a flow diagram illustrating an exemplary process 1900 for forming the gate stack 600 shown in FIG. 17A in accordance with some embodiments. FIGS. 19 to 23 illustrate schematic views of the intermediate stages of the process 1900.

Figure 19:
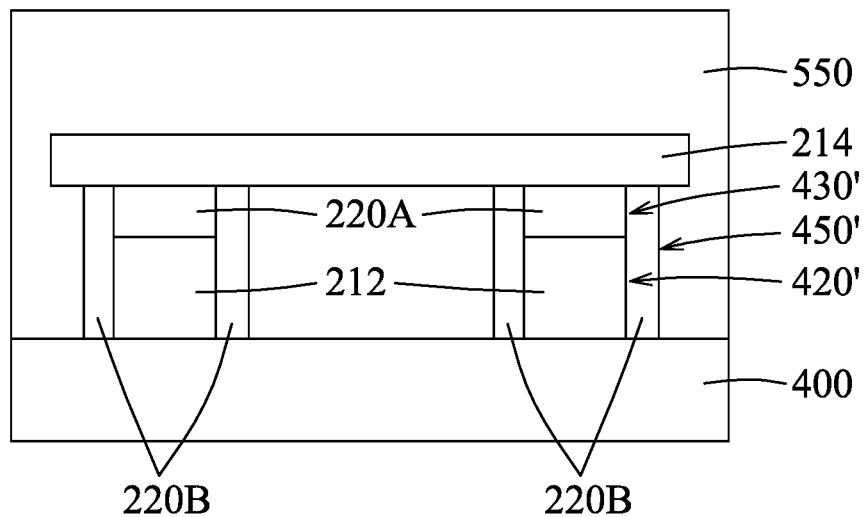
FIGS. 19 to 23 illustrate schematic views of intermediate stages of a process for forming a gate stack as depicted in FIG. 18 in accordance with some embodiments.

Referring to FIGS. 18 and 19, the process 1900 commences at step 1902, where a third ILD layer 550 is formed on the patterned channel material layer 214 by depositing a dielectric material, followed by performing a planarization process in a manner similar to those as described in steps 320 and 321. In some embodiments, the materials and deposition used for forming the third ILD layer 550 is similar to those used for the first ILD layer 400 and the second ILD layer 500, and the details thereof are omitted herein for the sake of brevity.

Figure 20A:
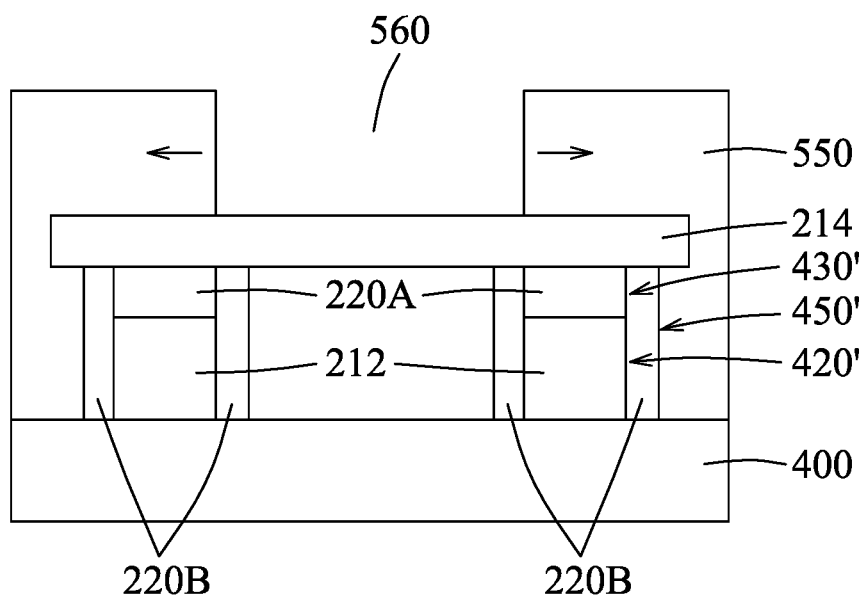
Figure 20B:
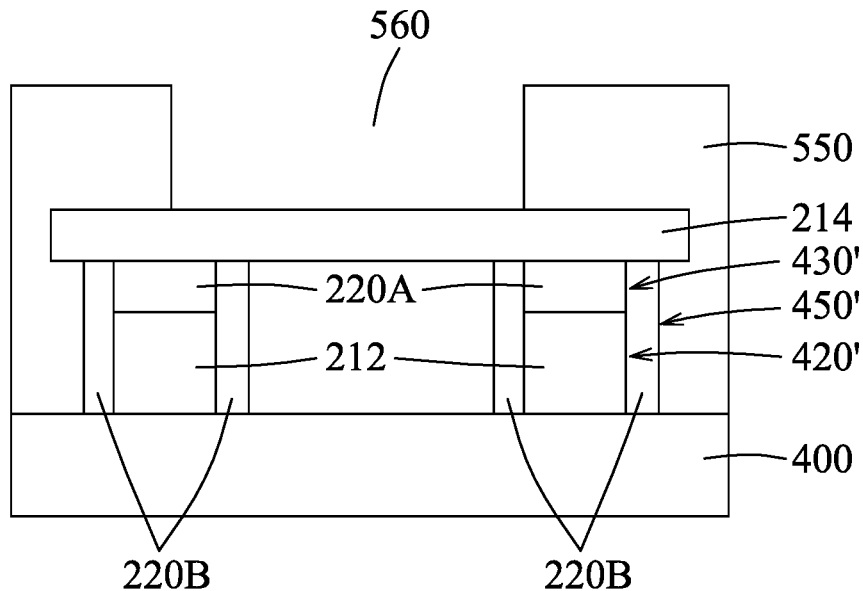
Figure 20C:
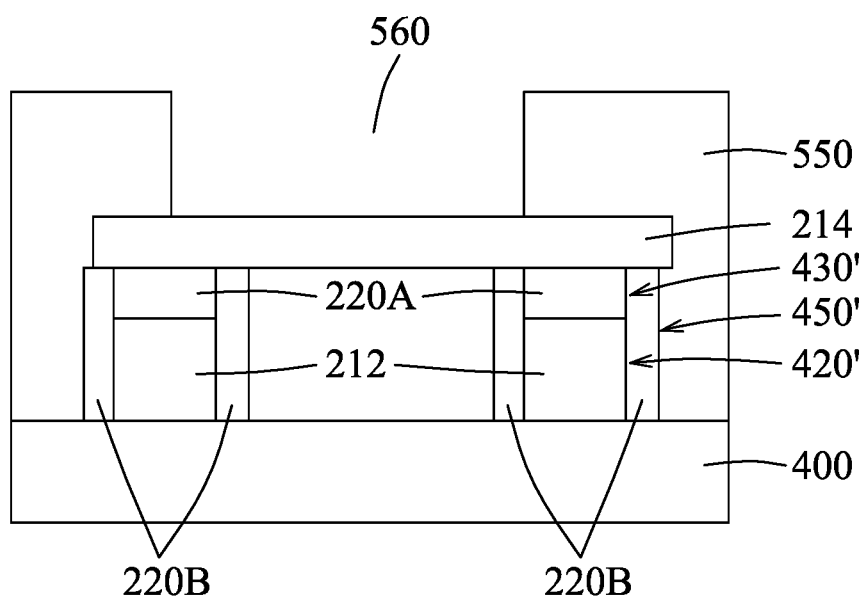

Referring to FIGS. 18 and 20A, the process 1900 proceeds to step 1904, where a patterning process (e.g., a photolithography process as described in step 310 followed by a dry etching process, or other suitable processes) is conducted to form a trench 560 in the third ILD layer 550. It is noted that, since a symmetric alignment of the gate stack 600 shown in FIG. 17A with respect to the patterned metal layer 420' is not necessary for the resulting transistor to function normally, the formation of the trench 560 is similarly robust. That is to say, a dimension of the trench 560 may be as illustrated in FIG. 20A, and may be expanded horizontally and outwardly from each of the two opposite ends thereof, for an arbitrary amount within the ranges as indicated by the arrows in FIG. 20A without affecting the performances of the resulting transistor 210. The resulting gate stack 600 maybe shifted to left or right from a location of the symmetric alignment for as much as about 10 nanometers without adversely affecting the performance of the transistor 210. FIG. 20B illustrates one alternative of the dimensions of the trench 560, which is misaligned with respect to the two metal sections 212 of the patterned metal layer 420', in accordance with some embodiments. FIG. 20C illustrates one alternative of the dimensions of the trench 560 and the patterned channel material layer 214, which are both misaligned with respect to the two metal sections 212 of the patterned metal layer 420', in accordance with some embodiments. For the sake of simplicity, the location of the trench 560 as illustrated in FIG. 20A will be used for subsequent figures.

Figure 21:
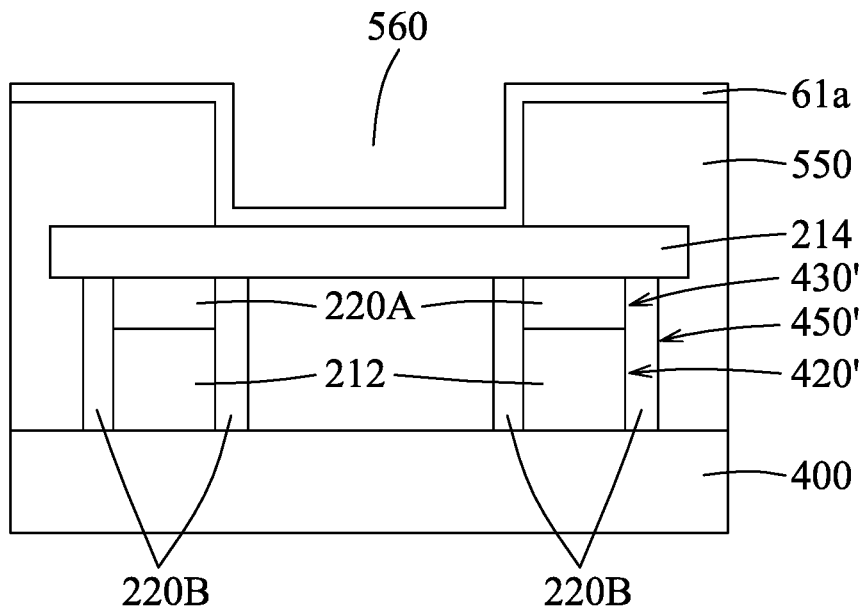

Referring to FIGS. 18 and 21, the process 1900 proceeds to step 1906, where a gate dielectric material layer 61a is conformally formed on the patterned channel material layer 214 (i.e., in the trench 560 formed in step 1904) and the third ILD layer 550. The gate dielectric material layer 61a may be formed by, for example, but not limited to, sputtering, CVD, PVD, ALD, plasma-enhanced ALD, molecular beam epitaxy (MBE), combinations thereof, or other suitable techniques. In some embodiments, the gate dielectric material layer 61a may include one or more layers, each being made using one or more of the abovementioned materials for fabricating the gate dielectric 216 shown in FIG. 1.

Figure 22:
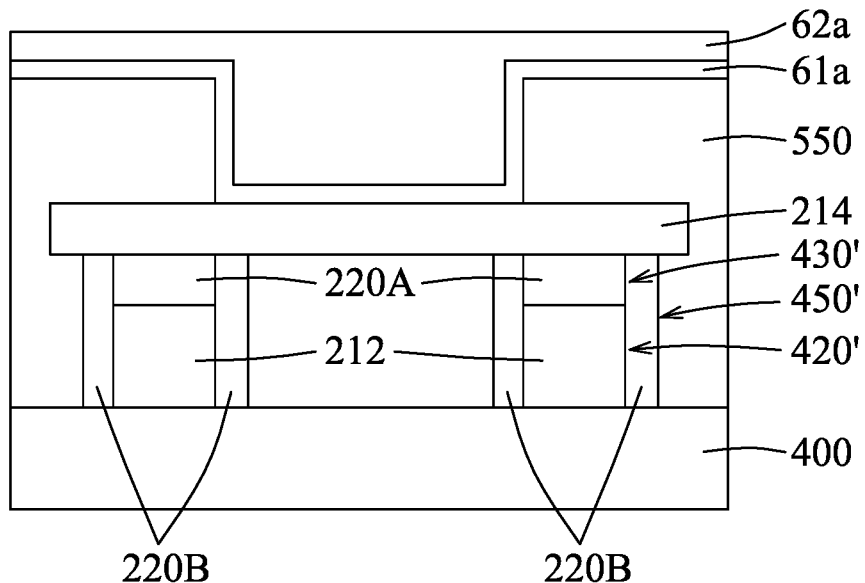

Referring to FIGS. 18 and 22, the process 1900 proceeds to step 1908, where a gate electrode material layer 62a is formed on the gate dielectric material layer 61a to fill the trench 560 shown in FIG. 21. The gate electrode material layer 62a may be deposited by, for example, but not limited to, ALD, PVD, CVD, sputtering, plating, combinations thereof, or other suitable techniques.

Figure 23:
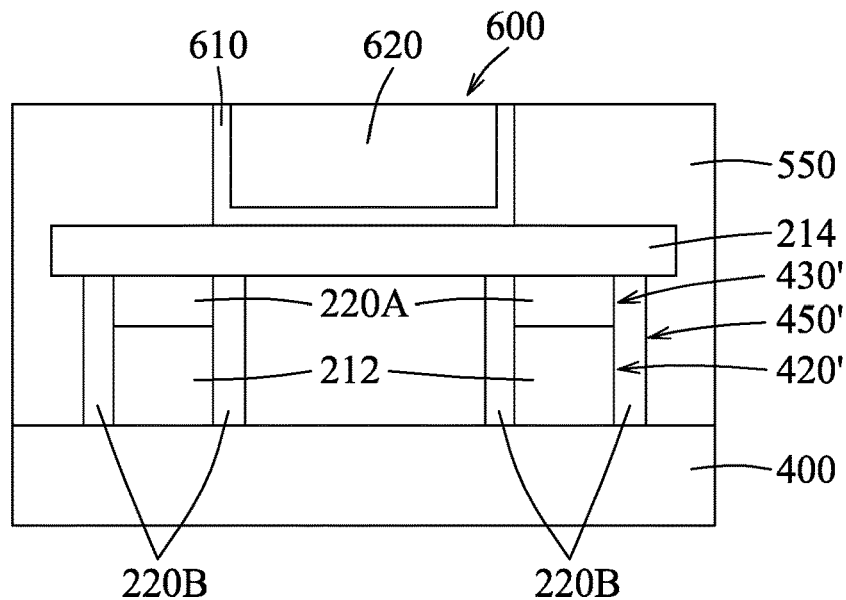

Referring to FIGS. 18 and 23, the process 1900 proceeds to step 1910, where a planarization process such as a CMP, or other suitable technique is performed to remove excesses of the gate electrode material layer 62a and the gate dielectric material layer 61a on the third ILD layer 550. In some embodiments, the CMP may be performed to the point that the third ILD layer 550 is exposed. At this stage, the gate electrode material layer 62a and the gate dielectric material layer 61a shown in FIG. 22 are respectively formed into the gate electrode 620 and the gate dielectric 610 of the gate stack 600, such that the semiconductor structure in FIG. 23 corresponds to that in FIG. 17A, in which the gate dielectric 610 is made to surround the gate electrode 620. In some embodiments, as shown in FIG. 17A or 23, a length of the gate stack 600 is smaller than that of the patterned channel material layer 214. In alternative embodiments, a width of the gate stack 600 may be slightly greater, or substantially the same as that of the patterned channel material layer 214.

In alternative embodiments, other suitable methods may also be applied for forming the semiconductor structures shown in FIG. 17A or 23. In yet alternative embodiments, additional features may be added to the semiconductor structure shown in FIG. 17A or 23, and some features of the semiconductor structures shown in FIG. 17A or 23 may be modified, replaced, or eliminated without departure from the spirit and scope of the present disclosure.

Figure 24:
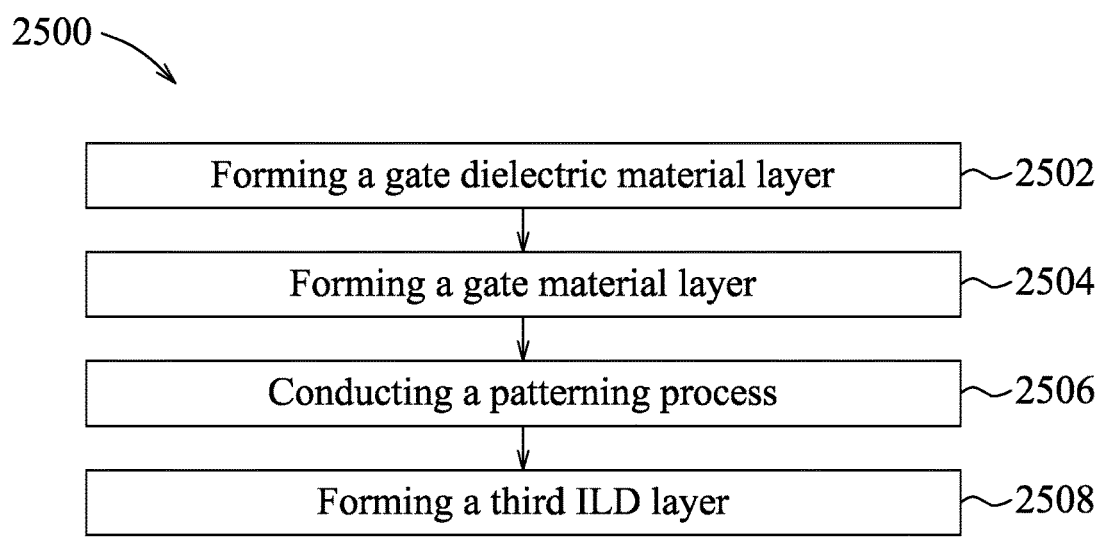
FIG. 24 is a flow diagram illustrating an exemplary process for forming a patterned channel material layer and a gate stack as shown in FIG. 17B in accordance with some embodiments.

FIG. 24 is a flow diagram illustrating an exemplary process 2500, performed after step 324 (i.e., the formation of the channel material layer 510) for forming the patterned channel material layer 214 and the gate stack 600' shown in FIG. 17B in accordance with some embodiments. FIGS. 25 to 28 illustrate schematic views of the intermediate stages of the process 2500.

Figure 25:
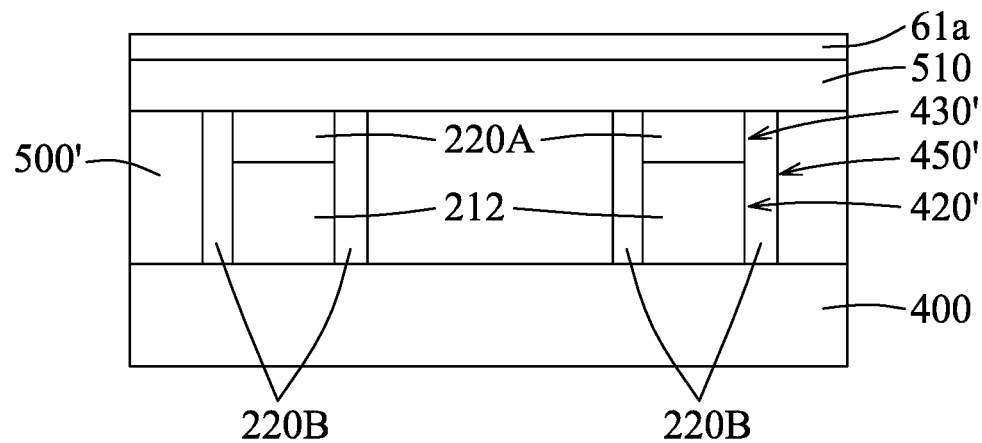
FIGS. 25 to 28 illustrate schematic views of intermediate stages of a process for forming a gate stack as depicted in FIG. 24 in accordance with some embodiments.

Referring to FIGS. 24 and 25, the process 2500 commences in step 2502, where a gate dielectric material layer 61a is formed on the channel material layer 510. The materials used for forming the gate dielectric material layer 61a may be similar to those used for forming the gate dielectric 216, and step 2502 may be implemented using a technique similar to that in step 1906, and details thereof are omitted herein for the sake of brevity. In some embodiments, the gate dielectric material layer 61a may include one or more layers, each being made using one or more of the above-mentioned materials used for fabricating the gate dielectric 216 shown in FIG. 1.

Figure 26:
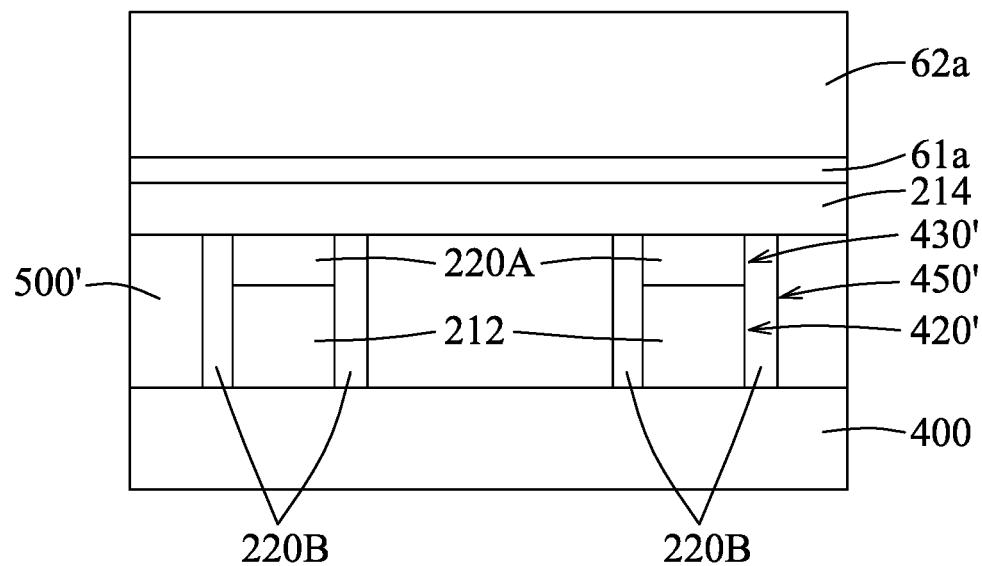

Referring to FIGS. 24 and 26, the process 2500 proceeds to step 2504, where a gate electrode material layer 62a is formed on the gate dielectric material layer 61a. The materials for forming the gate electrode material layer 62a may be similar to those used for forming the gate electrode 218, and step 2502 may be implemented using a technique similar to that in step 1908, and details thereof are omitted herein for the sake of brevity.

Figure 27:
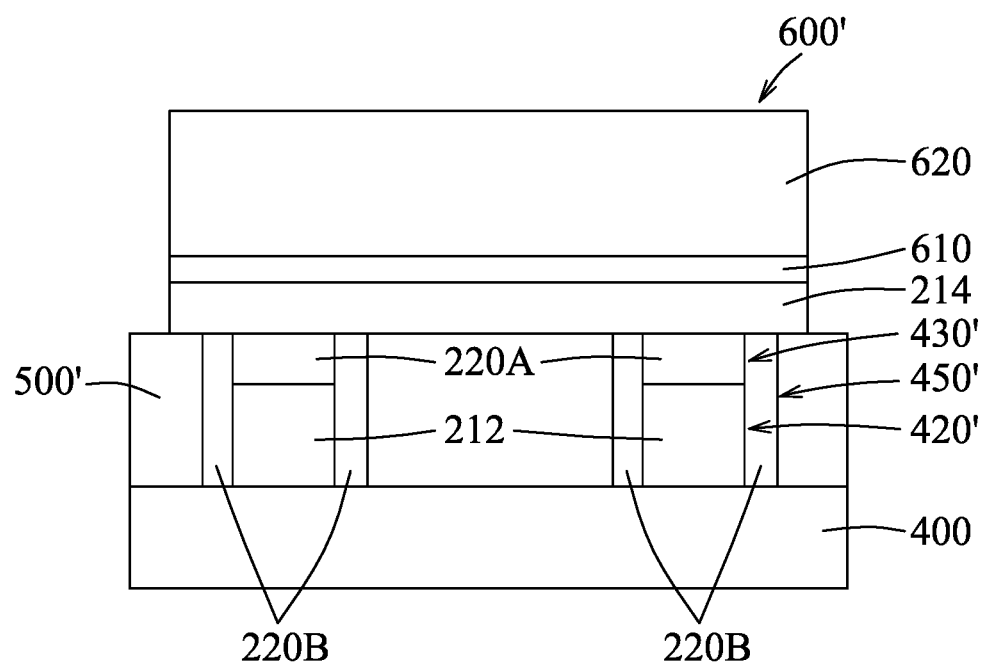

Referring to FIGS. 24 and 27, the process 2500 proceeds to step 2506, where a patterning process is conducted. In some embodiments, the patterning process may be implementing using procedures as described in steps 310 to 314, that is, conducting a photolithography process described in step 310 to form a patterned photoresist on the gate electrode material layer 62a shown in FIG. 26, conducting an etching process described in step 312 to form a patterned channel material layer 214, a patterned gate dielectric material layer (gate dielectric) 610, and a patterned gate electrode material layer (gate electrode) 620, and then removing the patterned photoresist. In this manner, the channel material layer 510, the gate dielectric material layer 61a and the gate electrode material layer 62a may be patterned in one single process. At this stage, the gate stack 600' including the gate dielectric 610 and the gate electrode 620 is obtained.

Figure 28:
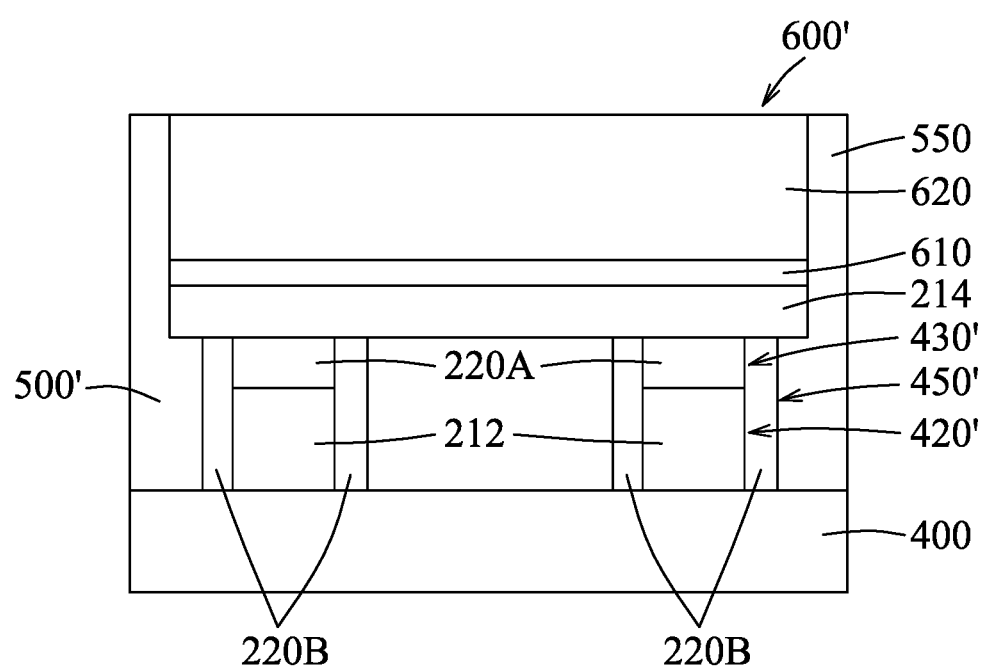

Referring to FIGS. 24 and 28, the process 2500 proceeds to step 2508, where a third ILD layer 550 is formed on the second ILD layer 500 to surround the gate stack 600', so as to "fill" the space created by the patterning process in step 2506. Step 2508 may be implemented by depositing a dielectric layer over the planarized second ILD layer 500' and the gate stack 600', followed by performing a planarization process, such as a CMP process or other suitable techniques so as to expose the gate stack 600'. It is noted that the semiconductor structure shown in FIG. 28 corresponds to that in FIG. 17B, and is different from that shown in FIG. 23 as the gate dielectric 610 does not surround the gate electrode 620, but generally have the same performance as the semiconductor structure shown in FIG. 23.

In alternative embodiments, other suitable methods may also be applied for forming the semiconductor structure shown in FIG. 17B or FIG. 28. In yet alternative embodiments, additional features may be added to the semiconductor structure shown in FIG. 17B or FIG. 28, and some features of the semiconductor structure shown in FIG. 17B or FIG. 28 may be modified, replaced, or eliminated without departure from the spirit and scope of the present disclosure.

Figure 29:
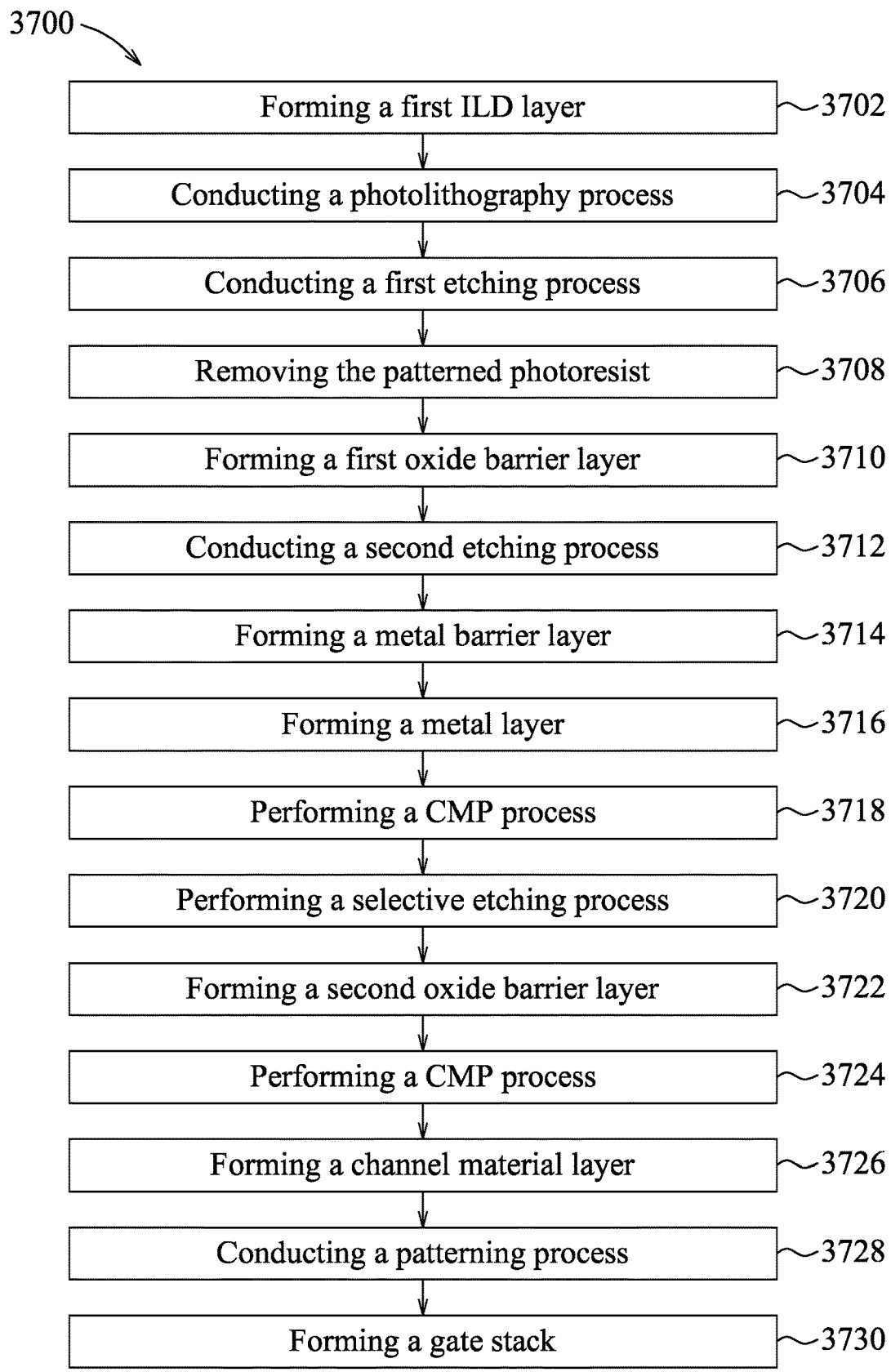
FIG. 29 is a flow diagram illustrating a method for manufacturing a semiconductor structure of FIG. 1 in accordance with some embodiments.

FIG. 29 is a flow diagram illustrating a method 3700 for manufacturing a semiconductor structure 200 of FIG. 1 in accordance with some embodiments. FIGS. 30 to 44 illustrate schematic views of the intermediate stages of the method 3700.

Figure 30:
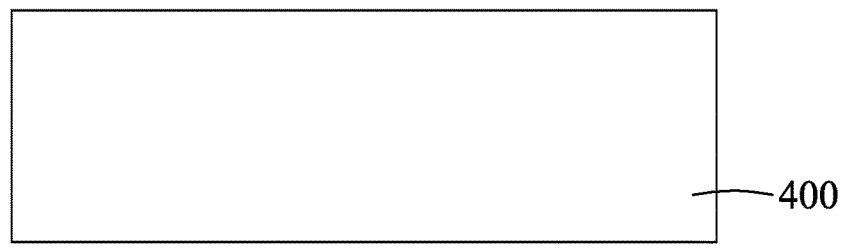
FIGS. 30 to 44 illustrate schematic views of intermediate stages of a method for manufacturing a semiconductor structure as depicted in FIG. 29 in accordance with some embodiments.

Referring to FIGS. 29 and 30, the method 3700 commences at step 3702, where a first ILD layer 400 is formed. In some embodiments, the first ILD layer 400 corresponding to the first dielectric layer 201 shown in FIG. 1 may be formed using a technique as described in step 302, and the details thereof are omitted herein for the sake of brevity. In some embodiments, step 3702 may be implemented in BEOL of the fabrication process.

Figure 31:
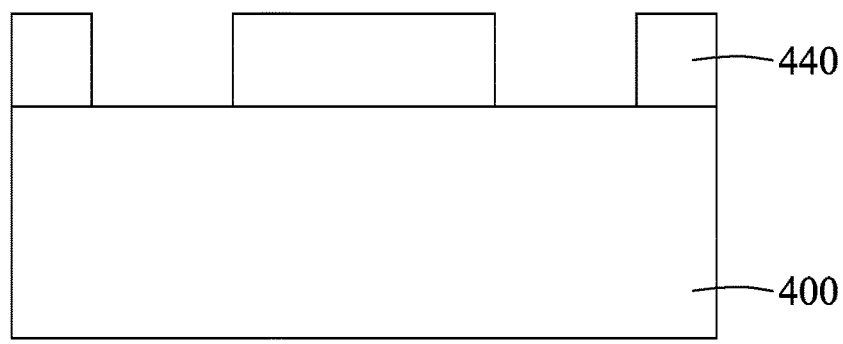

Referring to FIGS. 29 and 31, the method 3700 proceeds to step 3704, where a photolithography process is conducted to form a patterned photoresist 440. In some embodiments, the photolithography process may be performed using a technique as described in step 310, and the details thereof are omitted herein for the sake of brevity.

Figure 32:
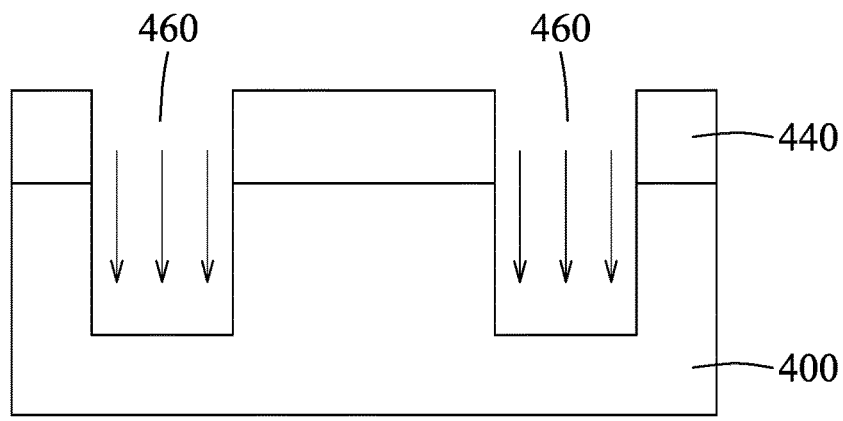

Referring to FIGS. 29 and 32, the method 3700 proceeds to step 3706, where a first etching process is conducted to pattern the first ILD layer 400. The first etching process may be implemented using a technique as described in step 312 to remove portions of the first ILD layer 400 through the patterned photoresist 440 in a top-down direction (as shown by the vertical arrows in FIG. 32). As a result, two trenches 460 are formed on the first ILD layer 400.

Figure 33:
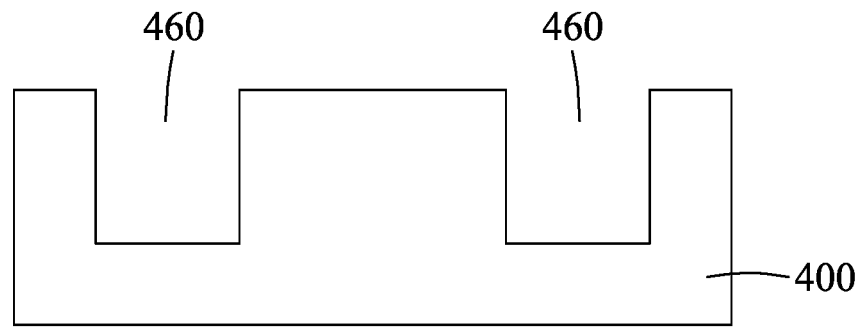

Referring to FIGS. 29 and 33, the method 3700 proceeds to step 3708, where the patterned photoresist 440 is stripped. Based on the materials of the patterned photoresist 440, a number of suitable chemical solutions may be used to strip the patterned photoresist 440.

Figure 34:
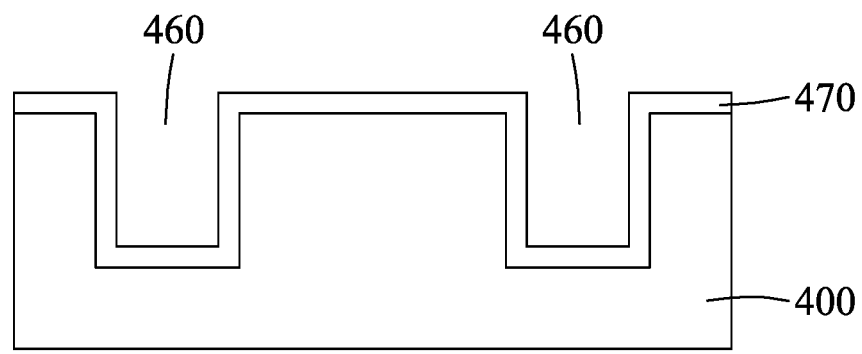

Referring to FIGS. 29 and 34, the method 3700 proceeds to step 3710, where a first barrier layer 470 is conformally formed on the first ILD layer 400 along inner surfaces of the trenches 460. The materials and techniques used for forming the first barrier layer 430 may be similar to those for forming the second barrier layer 450 as described in step 316, and the details thereof are omitted herein for the sake of brevity. A thickness of the first barrier layer 430 may correspond to the thickness of each of the extending sections 220B of the barrier regions 220 shown in FIG. 1.

Figure 35:
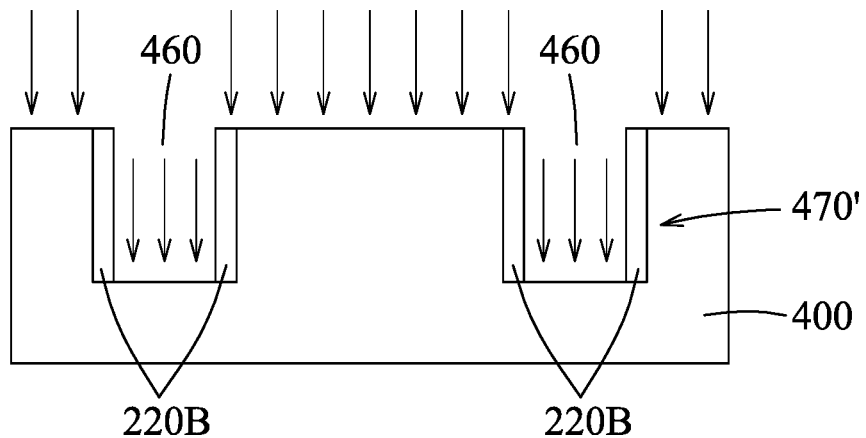

Referring to FIGS. 29 and 35, the method 3700 proceeds to step 3712, where a second etching process is conducted. The second etching process may be implemented using an anisotropic etching process similar to the second etching process as described in step 318, i.e., portions of the first barrier layer 470 are removed in a top-down direction (as shown by the vertical arrows in FIG. 35), so as to form a patterned first barrier layer 470'. The patterned first barrier layer 470' includes pairs of barrier sidewalls portions which correspond to the extending sections 220B of the barrier regions 220 shown in FIG. 1, and thus are also denoted by the numeral 220B. It is noted that the second etching process may be an optional process, that is, in some embodiments, the method 3700 may proceed directly from step 3710 to step 3714. That is to say, in some embodiments, the method may proceed to step 3714 with the first barrier layer 470 in the trenches 460 being intact.

Figure 36:
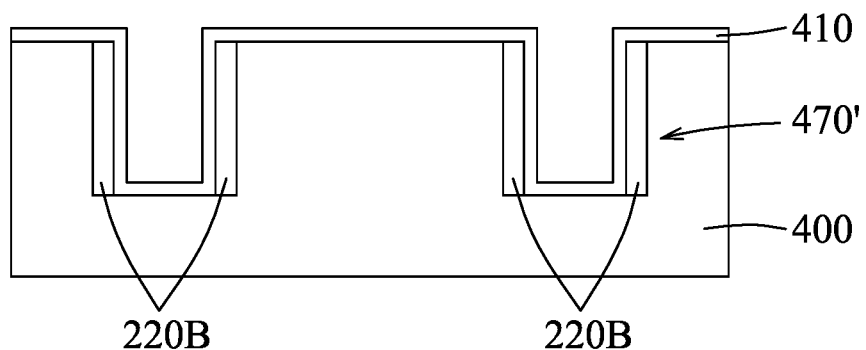

Referring to FIGS. 29 and 36, the method 3700 proceeds to step 3714, where a metal barrier layer 410 is formed on the first ILD layer 400 and the patterned first barrier layer 470'. The materials and techniques used for forming the metal barrier layer 410 may be similar to those described in step 304 and the details thereof are omitted herein for the sake of brevity.

Figure 37:
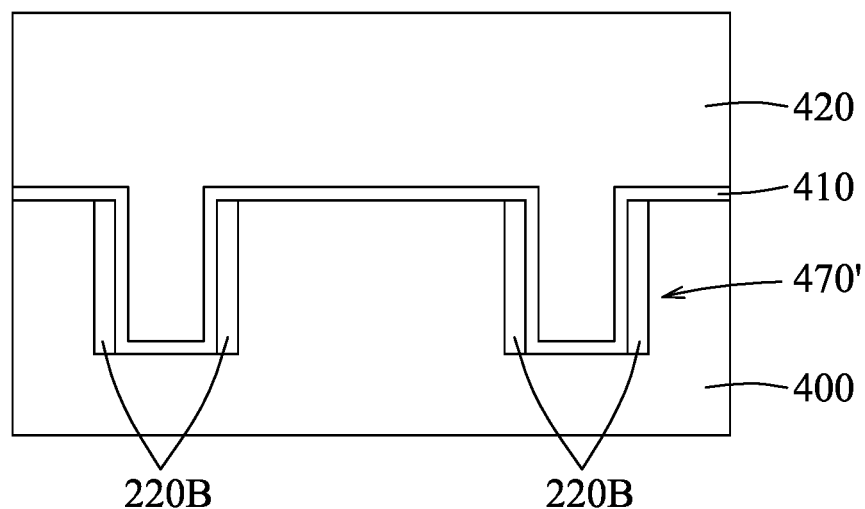

Referring to FIGS. 29 and 37, the method 3700 proceeds to step 3716, in which a metal layer 420 is formed on the metal barrier layer 410 to fill the trenches 460. The materials and techniques used for forming the metal layer 420 is similar to those described in step 306, and the details thereof are omitted herein for the sake of brevity.

Figure 38:
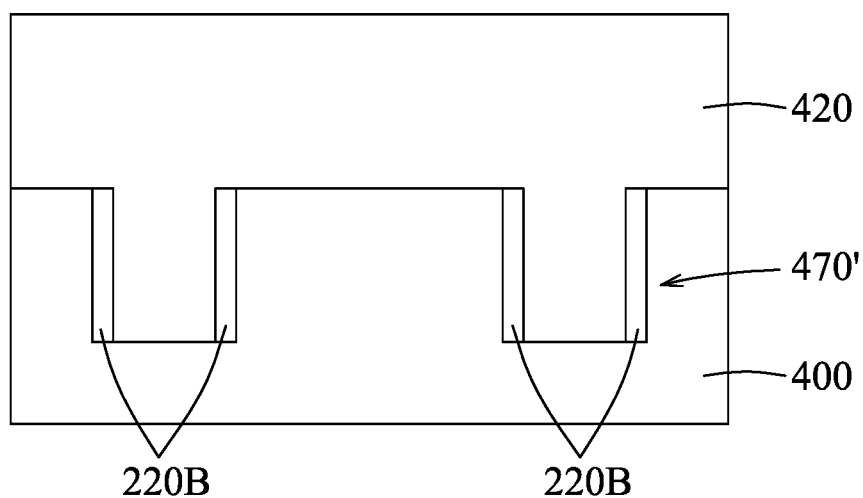

Referring to FIGS. 29 and 38, it is noted that in alternative embodiments, based on the different processes, the metal barrier layer 410 is an optional component, and the formation of the barrier layer 410 (i.e., step 3714) may be omitted. In such case, the method may proceed directly from step 3712 to step 3716, and the metal layer 420 is formed on the first ILD layer 400. For the sake of brevity, the configuration of the semiconductor structure as illustrated in FIG. 38 will be used thereafter.

Figure 39:
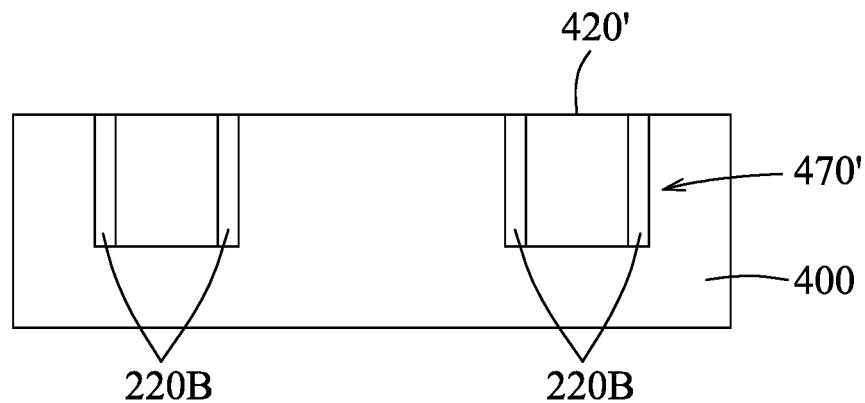

Referring to FIGS. 29 and 39, the method 3700 proceeds to step 3718, where a planarization process such as a CMP process, or other suitable techniques, is performed to expose a top surface of the metal layer 420. That is to say, parts of the metal layer 420 that are not located in the trenches 460 are removed, while parts of the metal layer 420 that are located in the trenches 460 remain therein, so as to form a patterned metal layer 420' that includes two metal portions. It is noted that the abovementioned steps for forming the metal portions may be referred to as a Damascene process.

Figure 40:
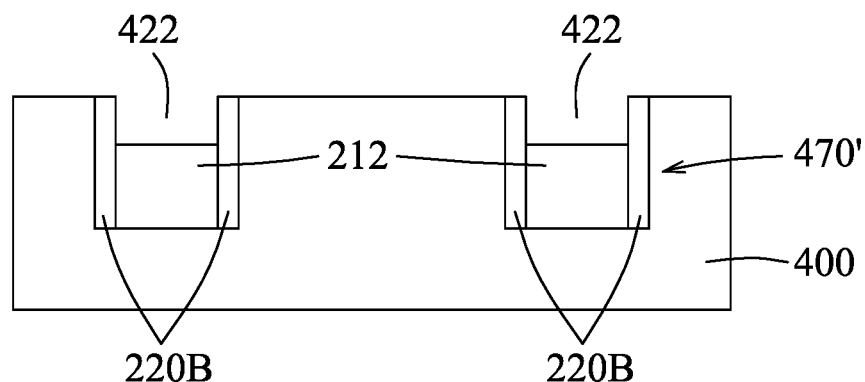

Referring to FIGS. 29 and 40, the method 3700 proceeds to step 3720, where a selective etching process is conducted to partially remove the metal portions of the patterned metal layer 420' so as to obtain two metal sections which correspond to the source/drain contacts 212 of the transistor 210 shown in FIG. 1, and thus are also denoted by the numeral 212. The selective etching process may be implemented using an anisotropic etching process which may be a dry etching process, a wet etching process, other suitable processes, or combinations thereof, so as to remove portions of the patterned metal layer 420' without removing the first ILD layer 400, the barrier sidewalls 220B, and the metal barrier layer 410. As a result, two recesses 422 are formed.

Figure 41:
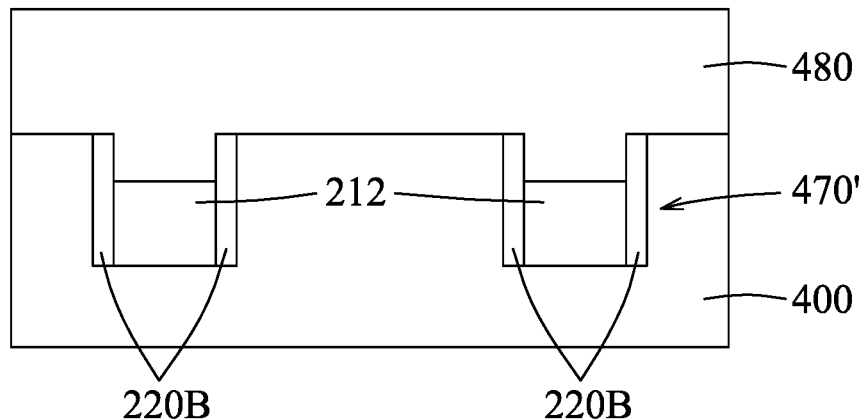

Referring to FIGS. 29 and 41, the method 3700 proceeds to step 3722, where a second barrier layer 480 is formed on the first ILD layer 400, the metal sections 212 and the patterned first barrier layer 470' to fill the recesses 422 shown in FIG. 40 so as to cover the metal sections 212. In some embodiments, the materials and techniques used for forming the second barrier layer 480 is similar to those for used for forming the first barrier layer 470 as described in step 3710, and the details thereof are omitted herein for the sake of brevity. It is noted that the second barrier layer 480 may include a material that is different from that of the first barrier layer 470, a material that is the same as that of the first barrier layer 470 but with different stoichiometry or phase, or a material that is exactly the same as that of the first barrier layer 470.

Figure 42:
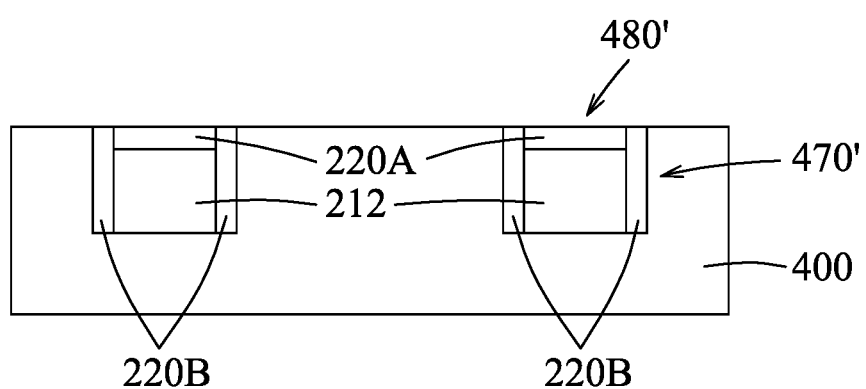

Referring to FIGS. 29 and 42, the method 3700 proceeds to step 3724, where a planarization process, such as a CMP process or other suitable processes, is performed to expose the first ILD layer 400, so as to form a patterned second barrier layer 480'. The patterned second barrier layer 480' includes two barrier sections which correspond to the interconnecting sections 220A of the barrier regions 220 shown in FIG. 1, and thus also denoted by the numeral 220A. As a result, the two source/drain contacts 212 and the corresponding barrier regions 220 of the transistor 210 (formed cooperatively by the patterned first barrier layer 470' and the patterned second barrier layer 480') as described in the FIG. 1 are fabricated at this stage.

Figure 43:
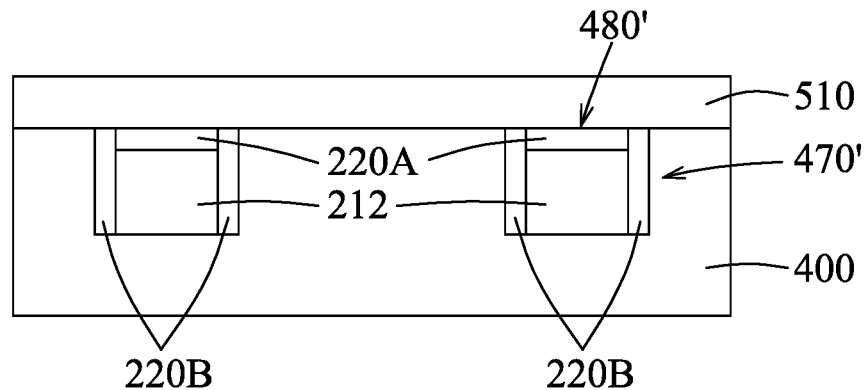

Referring to FIGS. 29 and 43, the method 3700 proceeds to step 3726, where a channel material layer 510 is formed on the patterned first barrier layer 470', the patterned second barrier layer 480', and the first ILD layer 400 (i.e., over the planarized surface formed by the CMP process in step 3724). In some embodiments, the materials used for forming the channel material layer 510 are similar to those used for forming the channel layer 214, the channel material layer 510 has a thickness similar to that of the channel layer 214, the formation of the channel material layer 510 may be implemented using a technique as described in step 324, and the details thereof are omitted herein for the sake of brevity.

Figure 44:
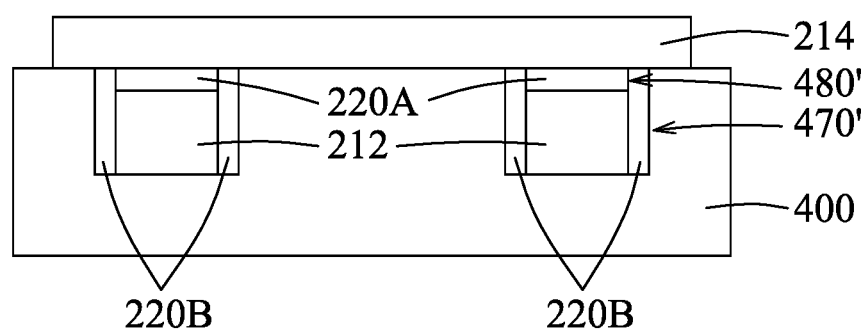

Referring to FIGS. 29 and 44, the method 3700 proceeds to step 3728, where a patterning process is conducted to pattern the channel material layer 510. In some embodiments, the patterning process may be implemented using the procedures as described in step 326. It is noted that a resulting patterned channel material layer 214 may have dimensions similar to those illustrated in FIG. 16A to 16C.

Referring again to FIG. 29, the method 3700 proceeds to step 3730, where a gate stack 600 or 600' shown in FIG. 17A or 17B is formed on the patterned channel material layer 214. It is noted that the gate stack 600 or 600' may be formed in a number of ways (e.g., as described in processes 1900 and 2500). In some embodiments, a gate replacement technique is employed for forming the gate stack 600 or 600'.

Figure 45:
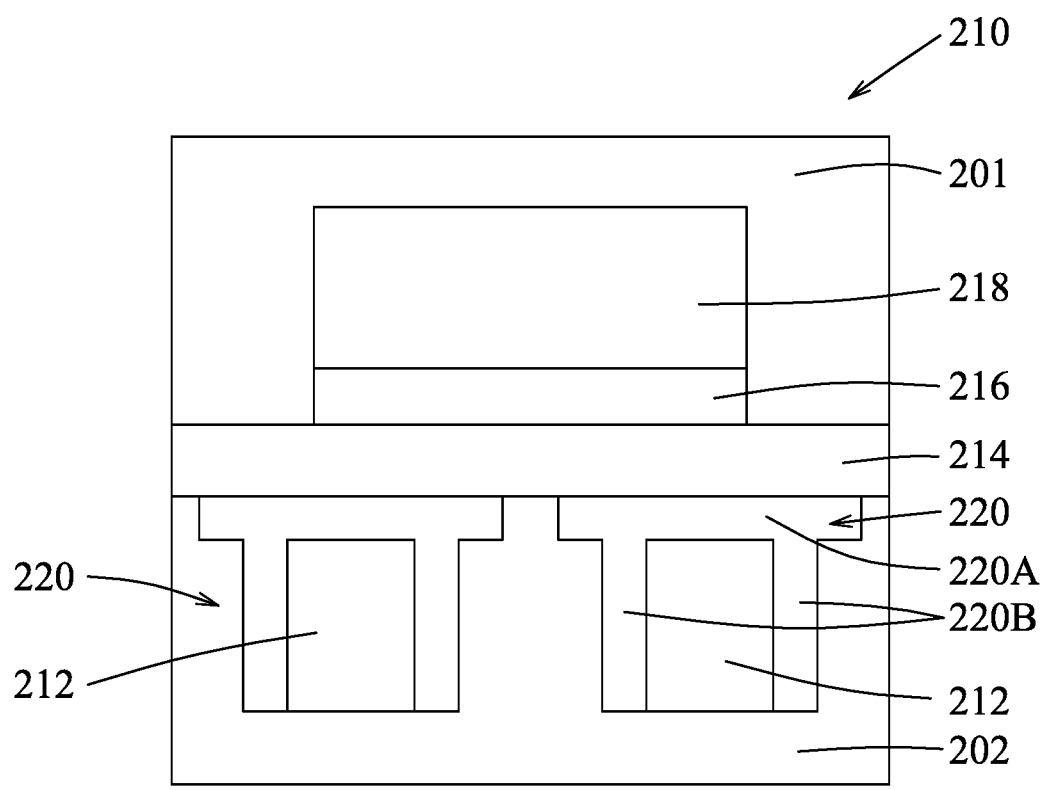
FIG. 45 illustrates a schematic cross-sectional view of a semiconductor structure in accordance with some embodiments.

FIG. 45 illustrates a schematic cross-sectional view of a semiconductor structure 200 in accordance with some embodiments. The semiconductor structure shown in FIG. 45 is similar to that shown in FIG. 1. It is noted that in the semiconductor structure 200 shown in FIG. 1, each of the barrier regions 220 is dimensioned to be inverted U-shaped, whilst in the semiconductor structure 200 shown in FIG. 45, each of the barrier regions 220 is dimensioned to be Π-shaped.

It is noted that the semiconductor structure as shown in FIG. 45 may be fabricated using procedures that is generally similar to those of the methods 300 and 3700. For example, after step 3722, the CMP process may be adjusted such that a portion of the patterned second barrier layer 480' over the first ILD layer 400 remains on a top surface of the first ILD layer 400. Afterward, a patterning process may be implemented so as to form the patterned second barrier layer 450' with the dimension similar to that illustrated in FIG. 45.

Figure 46:
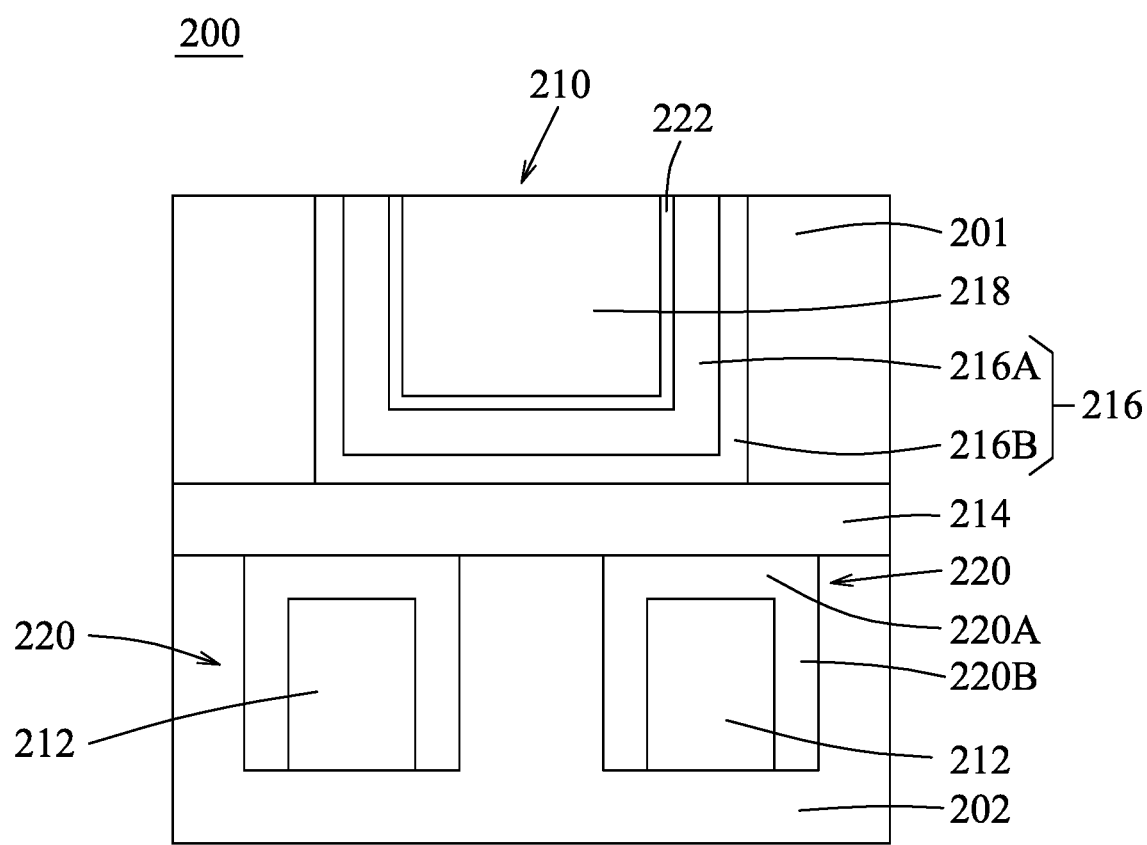
FIG. 46 illustrates a schematic cross-sectional view of a semiconductor structure in accordance with some embodiments.

FIG. 46 illustrates a schematic cross-sectional view of a semiconductor structure 200 in accordance with some embodiments. As exemplified in FIG. 46, the gate dielectric 216 may be a bi-layer structure which includes two different layers, i.e., gate dielectric layers 216A and 216B, each being made using one or more of the high-K dielectric materials as mentioned above. Additionally, the transistor 210 further includes a work function metal layer 222 that is disposed between the gate dielectric 216 and the gate electrode 218 for setting a work function of the transistor 210 (which in turn sets a threshold voltage of the transistor 210). The metal layer 222 may include titanium nitride (TiN), titanium aluminum (TiAl), tantalum nitride (TaN), tungsten, or combinations thereof. Other suitable materials for making the work function metal layer 222 are within the scope of the present disclosure.

It is noted that the semiconductor structure shown in FIG. 46 may be fabricated using procedures that is generally similar to those of the methods 300 and 3700, and those of processes 1900, 2500. In addition, the replacement gate process may be employed. For example, by utilizing process 1900, step 1906 may be implemented twice for forming each of the gate dielectric layers 216A, 216B, followed by an additional step for forming the work function metal layer 222 before proceeding to step 1908. It is noted that the semiconductor structures as shown in FIGS. 45 and 46 may possess advantages that are similar to those of the semiconductor structure 200 as shown in FIG. 1. For example, this structure may be useful for fabricating scaled thin-film transistors (TFT) in a BEOL process.

In this disclosure, a transistor of a semiconductor structure is provided, in which a barrier region is provided to surround each of the source/drain contacts. In this structure, hydrogen gas and/or free hydrogen atoms (which may be used or generated in various processes, such as CVD) from, for example, the source/drain contacts can be prevented from diffusing into the channel layer. As such, the channel layer may be less likely to be doped with hydrogen gas and/or free hydrogen atoms, and an adverse effect to a threshold voltage of the transistor may be reduced. In addition, because the hydrogen gas and/or the free hydrogen atoms may be absorbed by the barrier regions, a Schottky barrier may be improved, and a contact resistance between the source/drain contacts and the channel layer may be reduced.

In accordance with some embodiments of the present disclosure, a semiconductor structure includes a channel layer including an oxide semiconductor material, source/drain contacts disposed below the channel layer, and barrier regions that are in contact with the channel layer and that surround the source/drain contacts, respectively. Each of the barrier regions includes a material that absorbs hydrogen.

In accordance with some embodiments of the present disclosure, a method for manufacturing a semiconductor structure includes forming a dielectric layer, forming source/drain contacts on the dielectric layer, forming barrier regions to surround the source/drain contacts, respectively, and forming a channel layer, including an oxide semiconductor material, on the barrier regions. Each of the barrier regions includes a material that absorbs hydrogen.

In accordance with some embodiments of the present disclosure, a method for manufacturing a semiconductor structure includes forming trenches in a dielectric layer, forming pairs of barrier sidewalls in each of the trenches, forming source/drain contacts respectively in the trenches so as to permit each of the source/drain contacts to be surrounded by a respective pair of the barrier sidewalls, forming barrier sections, each of which covers a respective one of the source/drain contacts, and each of which interconnects the respective pair of the barrier sidewalls so as to form barrier regions, and forming a channel layer on the barrier regions. Each of the barrier regions includes one of the barrier sections and the respective pair of the barrier sidewalls. Each of the barrier regions includes a material that absorbs hydrogen. The channel layer includes an oxide semiconductor material.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a dielectric layer;
    forming source/drain contacts on the dielectric layer;
    forming barrier regions to surround the source/drain contacts, respectively, each of the barrier regions including a material that absorbs hydrogen, wherein each of the barrier regions includes a metal compound including Zr and Ni; and
    forming a channel layer on the barrier regions, the channel layer including an oxide semiconductor material,
    wherein formation of the barrier regions includes
        forming barrier sections respectively on upper surfaces of the source/drain contacts, and
        forming pairs of barrier sidewalls, each of the pairs of barrier sidewalls being formed to surround a respective one of the source/drain contacts,
    wherein forming the barrier sections and forming the pairs of the barrier sidewalls are performed in two different steps.

2. The method of claim 1, wherein formation of the barrier regions includes:
    forming a first barrier layer;
    patterning the first barrier layer so as to form the barrier sections respectively on the upper surfaces of the source/drain contacts;
    forming a second barrier layer to cover the barrier sections and the upper surfaces of the source/drain contacts; and
    patterning the second barrier layer so as to form the second barrier layer into the pairs of barrier sidewalls, each of the pairs of barrier sidewalls extending respectively from two ends of the barrier sections.

3. The method of claim 1, further comprising:
    forming a gate dielectric layer on the channel layer; and
    forming a gate electrode on the gate dielectric layer.

4. The method of claim 2, wherein the source/drain contacts and the barrier sections are formed by
    forming a metal layer on the dielectric layer,
    forming the first barrier layer on the metal layer, and
    patterning the metal layer and the first barrier layer so as to form the metal layer into the source/drain contacts and so as to form the first barrier layer into the barrier sections.

5. The method of claim 1, wherein a minimum distance between two adjacent ones of the barrier regions is larger than 15 nanometers.

6. A method for manufacturing a semiconductor structure, comprising:
    forming trenches in a dielectric layer;
    forming pairs of barrier sidewalls respectively in the trenches such that the dielectric layer is exposed from bottom surfaces of the trenches;
    forming source/drain contacts respectively in the trenches so as to permit each of the source/drain contacts to be surrounded by a respective pair of the barrier sidewalls;
    after forming the source/drain contacts, forming barrier sections each of which covers a respective one of the source/drain contacts, and each of which interconnects the respective pair of the barrier sidewalls so as to form barrier regions each including one of the barrier sections and the respective pair of the barrier sidewalls, each of the barrier regions including a material that receives hydrogen, wherein each of the barrier regions includes a metal compound including Zr and Ni and each of the barrier sections has an upper surface that is flush with an upper surface of the dielectric layer; and
    after forming the barrier sections, forming a channel layer on the barrier regions, the channel layer including an oxide semiconductor material.

7. The method of claim 6, wherein the oxide semiconductor material includes indium gallium zinc oxide, tungsten-doped indium oxide, indium zinc oxide, indium tin oxide, gallium oxide, indium oxide, or combinations thereof.

8. The method of claim 6, further comprising:
    forming a gate dielectric layer on the channel layer; and
    forming a gate electrode on the gate dielectric layer.

9. The method of claim 6, wherein the source/drain contacts are formed in the dielectric layer using a Damascene process.

10. The method of claim 8, wherein the gate dielectric layer is formed after forming the channel layer.

11. The method of claim 8, wherein the gate electrode is formed after forming the channel layer.

12. The method of claim 6, wherein the source/drain contacts are formed after forming the pairs of the barrier sidewalls.

13. The method of claim 6, wherein each of the source/drain contacts has a lower surface which is opposite to a respective one of the barrier sections, and which is in direct contact with the dielectric layer.

14. The method of claim 6, wherein each of the source/drain contacts includes tungsten, ruthenium, copper, titanium nitride, tantalum nitride, or combinations thereof.

15. A method for manufacturing a semiconductor structure, comprising:
forming trenches in a dielectric layer;
forming a first barrier layer over the dielectric layer, the first barrier layer being made of a first material that receives hydrogen, and having
an upper barrier portion formed on an upper surface of the dielectric layer,
bottom barrier portions each of which is formed on a bottom surface of a respective one of the trenches, and
pairs of sidewall barrier portions, each of the pairs of sidewall barrier portions is formed on a lateral surface of a respective one of the trenches, the lateral surface connecting the bottom surface with the upper surface of the dielectric layer;
removing the upper barrier portion and the bottom barrier portions;
after removing the upper barrier portion and the bottom barrier portions, forming source/drain contacts respectively in the trenches so that each of the source drain contacts is surrounded by a respective pair of the sidewall barrier portions, each of the source drain contacts having a top surface at a level lower than a level of the upper surface of the dielectric layer;

forming a second barrier layer over the dielectric layer to cover the source/drain contacts, the second barrier layer being made of a second material that receives hydrogen;
performing a planarization process on the second barrier layer to expose the dielectric layer such that the second barrier layer is formed into barrier sections which cover the source/drain contacts, respectively;
after performing a planarization process, forming a channel layer on the barrier sections, the channel layer including an oxide semiconductor material.

16. The method of claim 15, wherein each of the first material and the second material includes indium gallium zinc oxide, indium zinc oxide, zinc oxide, indium tin oxide, tungsten-doped indium oxide, indium oxide, gallium oxide, crystalline indium gallium zinc oxide, indium gallium silicon zinc oxide, a metal compound including Zr and Ni, or combinations thereof.

17. The method of claim 15, wherein the oxide semiconductor material includes indium gallium zinc oxide, tungsten-doped indium oxide, indium zinc oxide, indium tin oxide, gallium oxide, indium oxide, or combinations thereof.

18. The method of claim 15, wherein each of the source/drain contacts includes tungsten, ruthenium, copper, titanium nitride, tantalum nitride, or combinations thereof.

19. The method of claim 15, further comprising:
after forming the channel layer, forming a gate dielectric layer on the channel layer opposite to the dielectric layer; and
forming a gate electrode on the gate dielectric layer opposite to the channel layer.

20. The method of claim 15, wherein each of the source/drain contacts includes tungsten, ruthenium, copper, titanium nitride, tantalum nitride, or combinations thereof.

* * * * *